(12) United States Patent
Ching et al.

(10) Patent No.: US 12,183,808 B2
(45) Date of Patent: Dec. 31, 2024

(54) REDUCING PARASITIC CAPACITANCE FOR GATE-ALL-AROUND DEVICE BY FORMING EXTRA INNER SPACERS

(71) Applicant: Taiwan Semiconductor Manufacturing Co., Ltd., Hsin-Chu (TW)

(72) Inventors: Kuo-Cheng Ching, Zhubei (TW); Chih-Hao Wang, Baoshan Township (TW); Shi Ning Ju, Hsinchu (TW); Kuan-Lun Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/355,253

(22) Filed: Jul. 19, 2023

(65) Prior Publication Data

US 2023/0369458 A1 Nov. 16, 2023

Related U.S. Application Data

(60) Continuation of application No. 17/379,208, filed on Jul. 19, 2021, now Pat. No. 11,764,286, which is a
(Continued)

(51) Int. Cl.
*H01L 29/66* (2006.01)
*H01L 21/02* (2006.01)
(Continued)

(52) U.S. Cl.
CPC .... *H01L 29/6656* (2013.01); *H01L 21/02532* (2013.01); *H01L 21/823412* (2013.01);
(Continued)

(58) Field of Classification Search
CPC .......... H01L 29/6656; H01L 29/66545; H01L 29/66553; H01L 29/66795; H01L 29/785; H01L 29/775; H01L 29/165; H01L 21/823431; H01L 21/823412; H01L 21/823437; H01L 21/823468;
(Continued)

(56) References Cited

U.S. PATENT DOCUMENTS 7,667,271 B2   2/2010   Yu et al.
7,910,453 B2   3/2011   Xu et al.
(Continued)

FOREIGN PATENT DOCUMENTS

CN   106030815 A   10/2016
CN   107134454 A   9/2017
(Continued)

*Primary Examiner* — Mouloucoulaye Inoussa
(74) *Attorney, Agent, or Firm* — HAYNES AND BOONE, LLP

(57) ABSTRACT

A semiconductor device includes a plurality of nanostructures. The nanostructures each contain a semiconductive material. A plurality of first spacers circumferentially wrap around the nanostructures. A plurality of second spacers circumferentially wrap around the first spacers. A plurality of third spacers is disposed between the second spacers vertically. A gate structure surrounds the second spacers and the third spacers.

20 Claims, 21 Drawing Sheets

Related U.S. Application Data division of application No. 16/446,312, filed on Jun. 19, 2019, now Pat. No. 11,069,793.

(60) Provisional application No. 62/738,121, filed on Sep. 28, 2018.

(51) Int. Cl.
  *H01L 21/8234* (2006.01)
  *H01L 27/088* (2006.01)
  *H01L 29/165* (2006.01)
  *H01L 29/775* (2006.01)
  *H01L 29/78* (2006.01)

(52) U.S. Cl.
  CPC ........... *H01L 21/823431* (2013.01); *H01L 21/823437* (2013.01); *H01L 21/823468* (2013.01); *H01L 27/0886* (2013.01); *H01L 29/165* (2013.01); *H01L 29/66545* (2013.01); *H01L 29/66553* (2013.01); *H01L 29/66795* (2013.01); *H01L 29/775* (2013.01); *H01L 29/785* (2013.01)

(58) Field of Classification Search
  CPC .......... H01L 21/02532; H01L 27/0886; H01L 29/78696; H01L 29/0665; H01L 29/42376; H01L 29/42392; H01L 21/02603; H01L 21/823481; H01L 21/823418; H01L 27/0921; H01L 27/0924; H01L 29/0673; H01L 21/845; H01L 21/32053; H01L 29/41791; H01L 2029/7858
  USPC .............. 438/283, 199; 257/369, 9, E29.024
  See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,728,332 B2 | 5/2014 | Lin et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,822,243 B2 | 9/2014 | Yan et al. | |
| 8,823,065 B2 | 9/2014 | Wang et al. | |
| 8,860,148 B2 | 10/2014 | Hu et al. | |
| 2006/0091468 A1 | 5/2006 | Liaw | |
| 2011/0281208 A1 | 11/2011 | Lin et al. | |
| 2012/0278776 A1 | 11/2012 | Lei et al. | |
| 2012/0305886 A1* | 12/2012 | Sleight | H01L 29/775 257/E29.024 |
| 2013/0295769 A1 | 11/2013 | Lin et al. | |
| 2013/0320451 A1 | 12/2013 | Liu et al. | |
| 2014/0001441 A1* | 1/2014 | Kim | H01L 29/78 257/29 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2016/0118483 A1* | 4/2016 | Flachowsky | H01L 29/165 257/192 |
| 2016/0141381 A1* | 5/2016 | Kim | H01L 29/785 257/288 |
| 2017/0018610 A1* | 1/2017 | Suk | H01L 29/66795 |
| 2017/0104062 A1* | 4/2017 | Bi | H01L 29/78696 |
| 2017/0141112 A1 | 5/2017 | Cheng et al. | |
| 2017/0186846 A1* | 6/2017 | Badaroglu | H01L 29/66795 |
| 2017/0200738 A1* | 7/2017 | Kim | H01L 29/66439 |
| 2017/0250291 A1* | 8/2017 | Lee | H01L 29/0665 |
| 2017/0256609 A1* | 9/2017 | Bhuwalka | H01L 29/78696 |
| 2017/0301554 A1 | 10/2017 | Bi et al. | |
| 2017/0345945 A1* | 11/2017 | Lee | H01L 29/775 |
| 2018/0069006 A1 | 3/2018 | Kim et al. | |
| 2018/0277448 A1* | 9/2018 | Chen | H01L 29/517 |
| 2020/0105902 A1 | 4/2020 | Ching et al. | |

FOREIGN PATENT DOCUMENTS

| | | |
|---|---|---|
| CN | 107795516 A | 3/2018 |
| KR | 20180027186 | 3/2018 |
| TW | 201719901 A | 6/2017 |
| TW | 201730937 A | 9/2017 |
| TW | 201735179 A | 10/2017 |

* cited by examiner

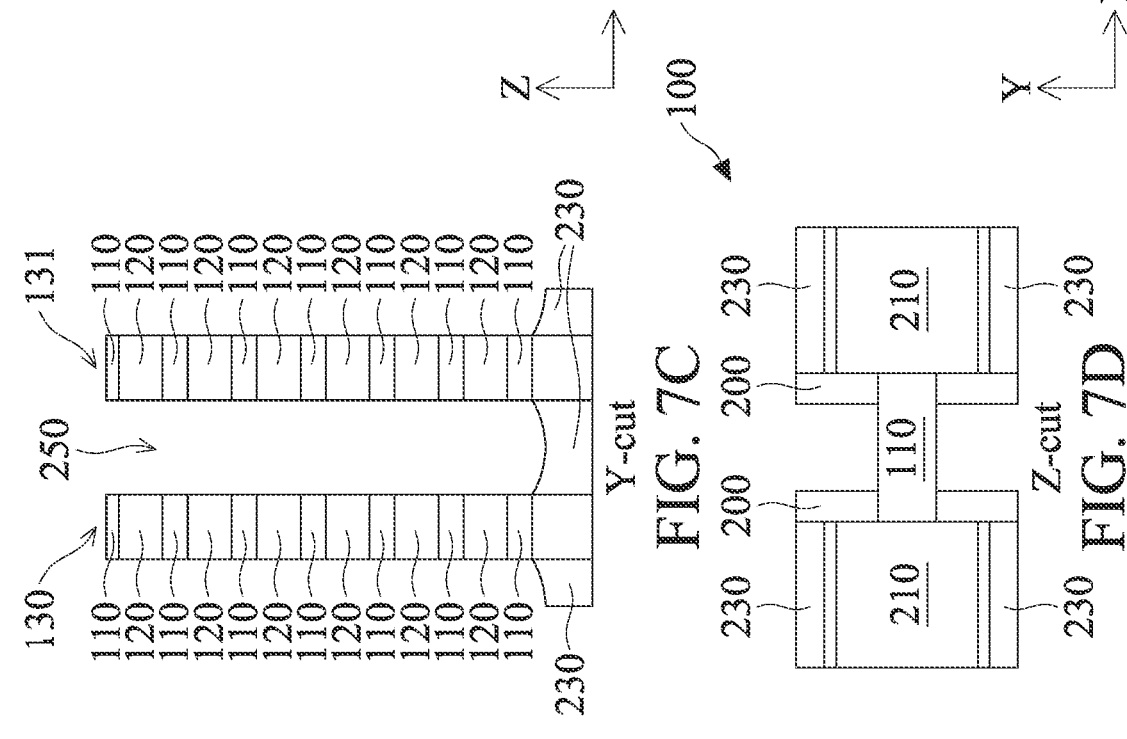
FIG. 7B X-cut
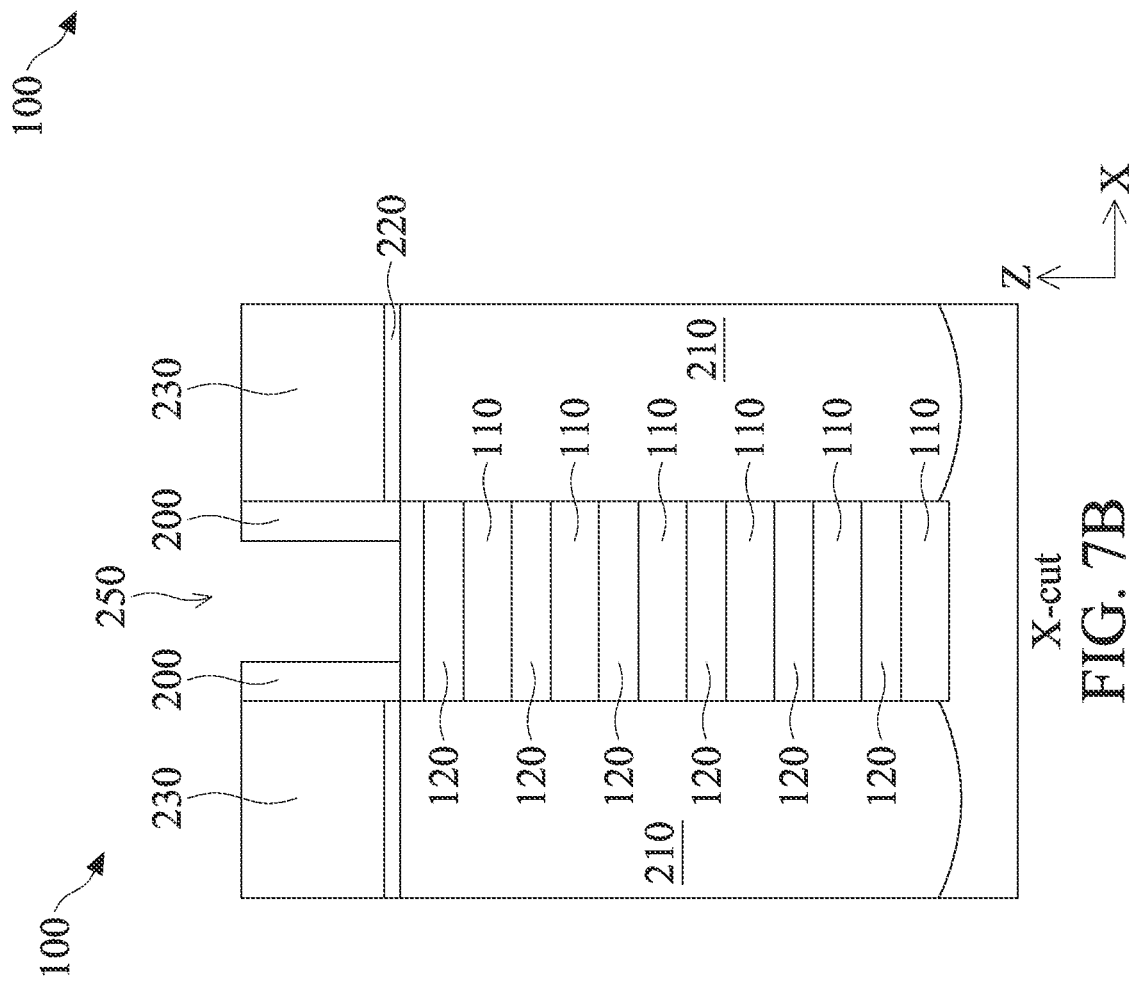
FIG. 7C Y-cut
FIG. 7D Z-cut

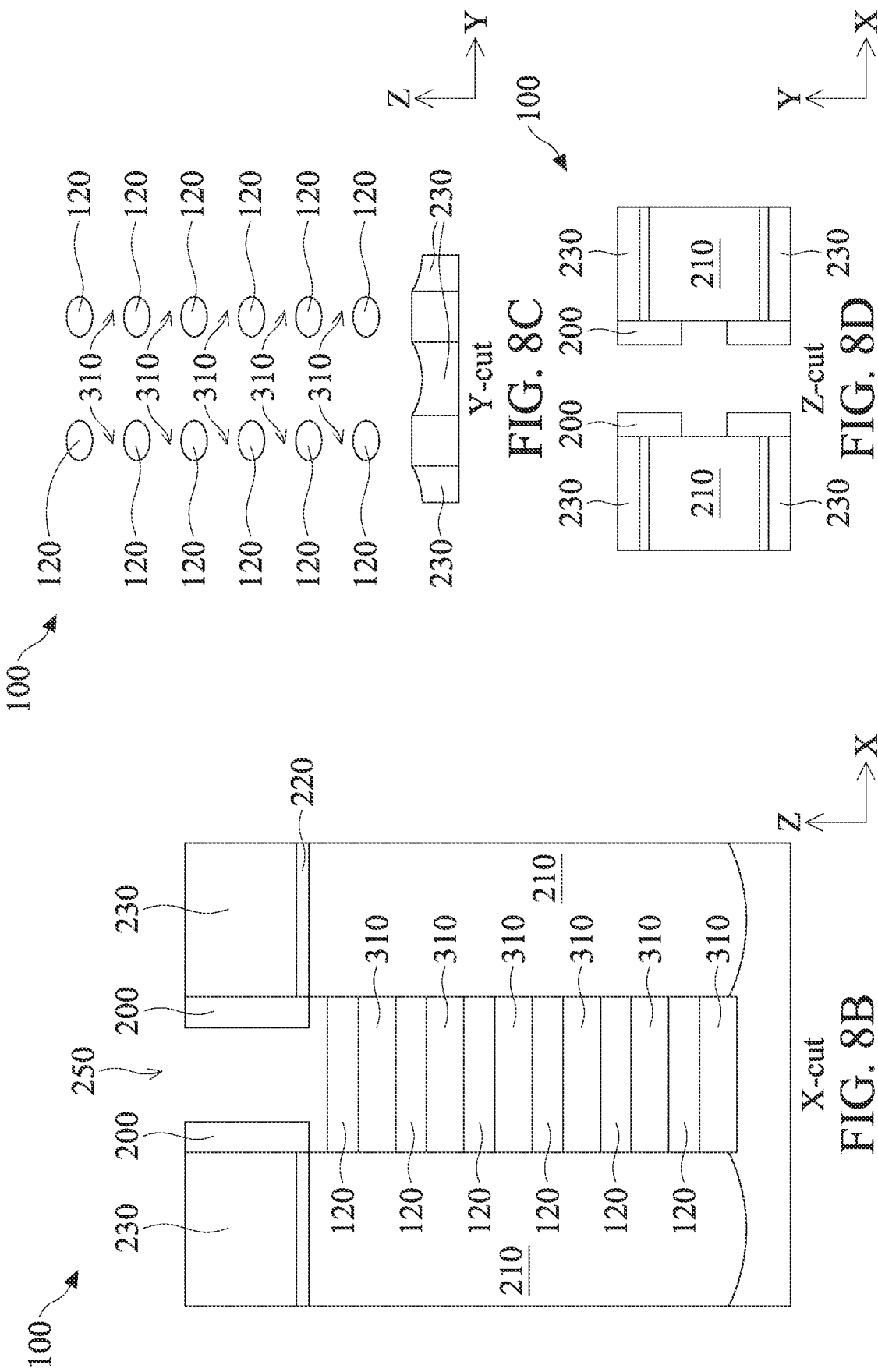

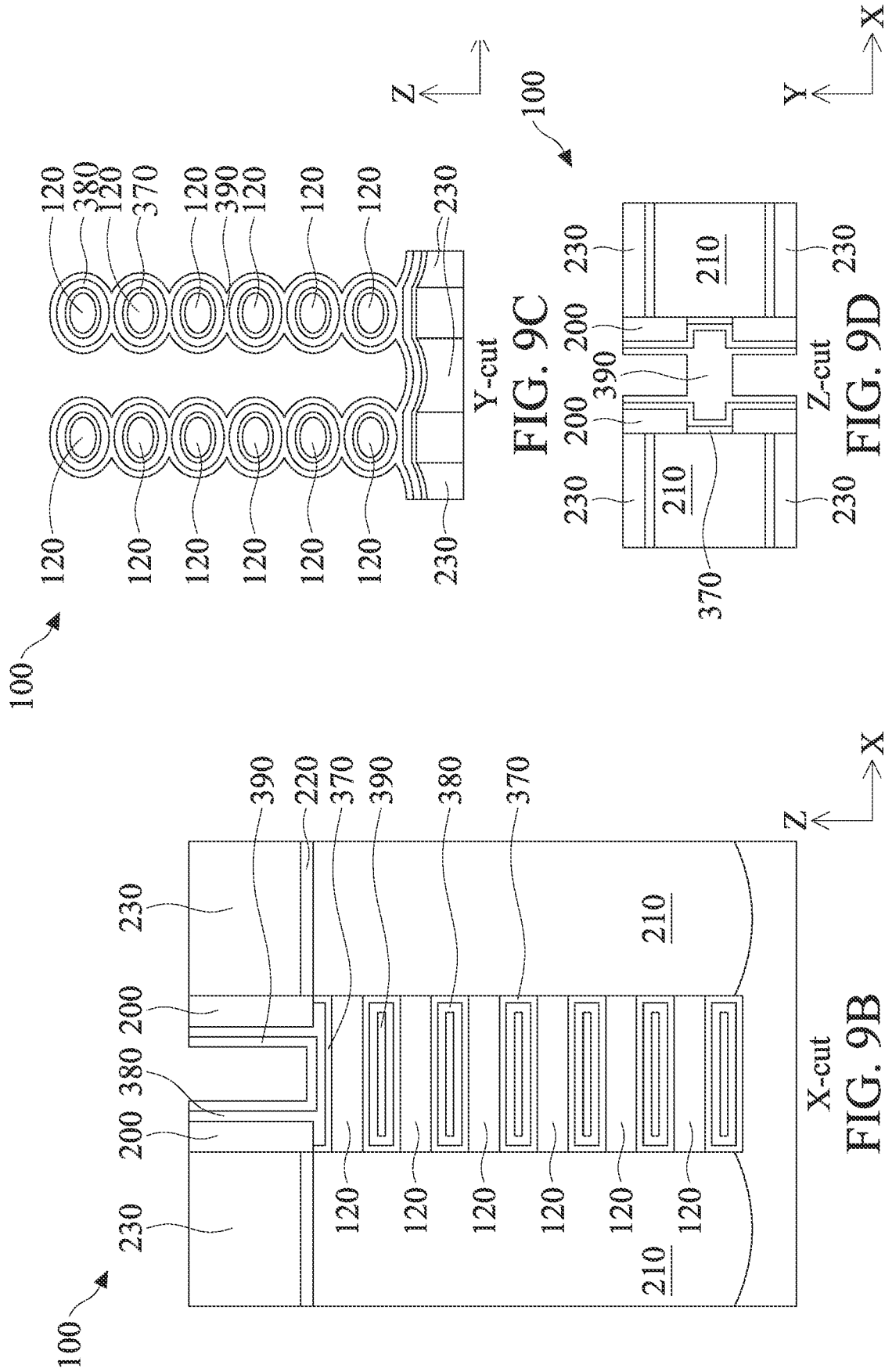

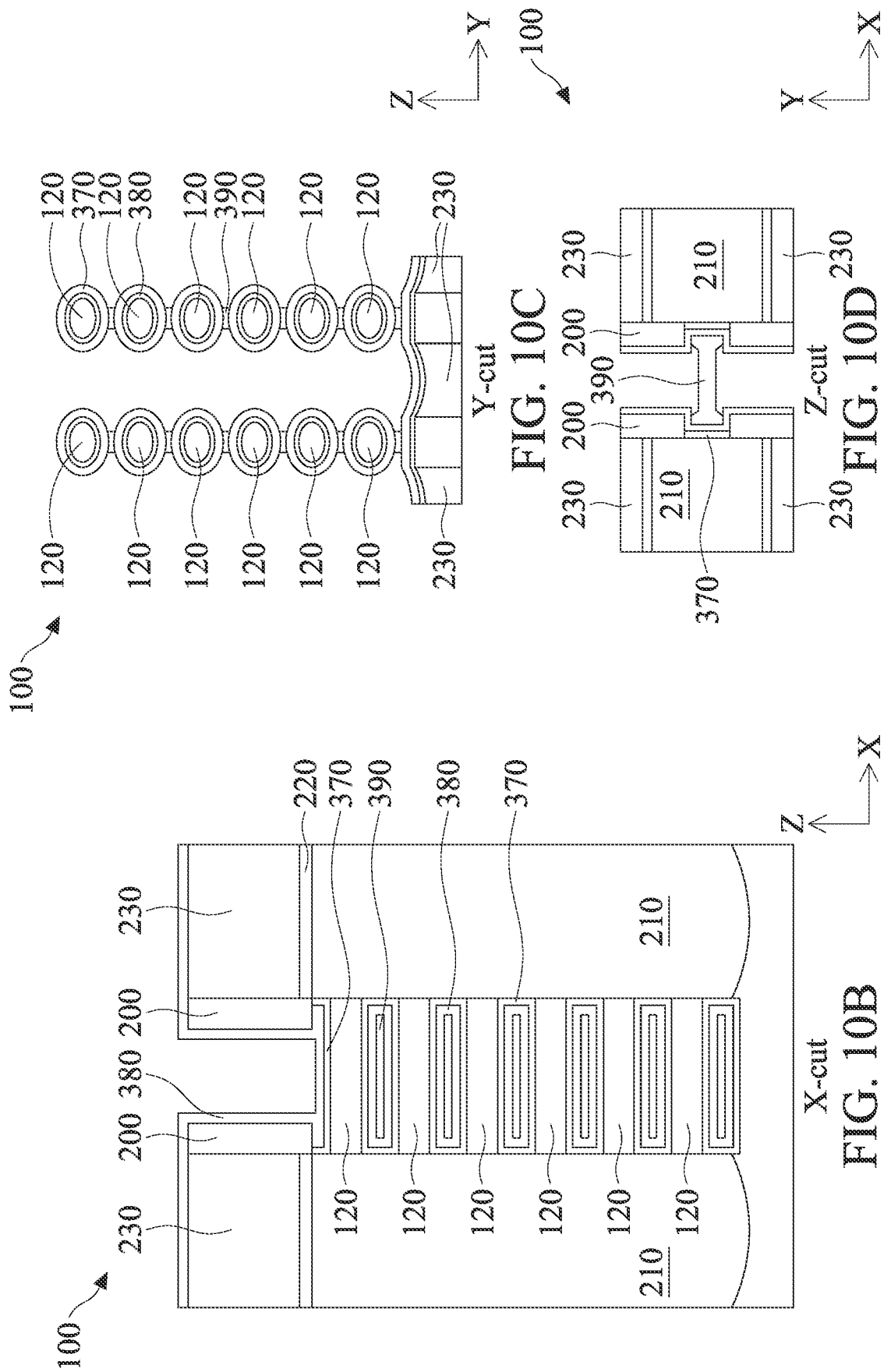

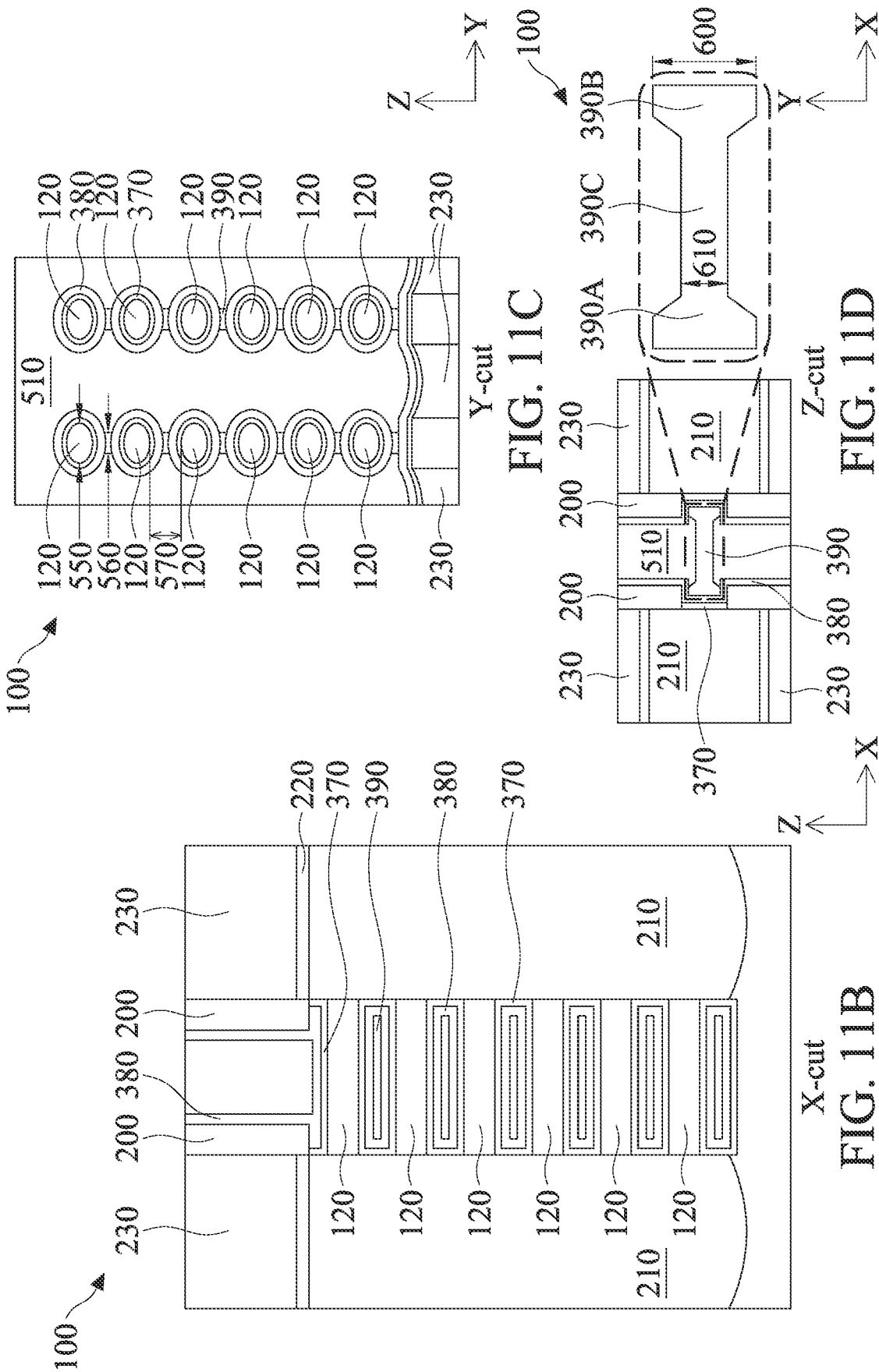

Y-cut

Z-cut

X-cut

Y-cut

Z-cut

X-cut

Y-cut

Z-cut

X-cut

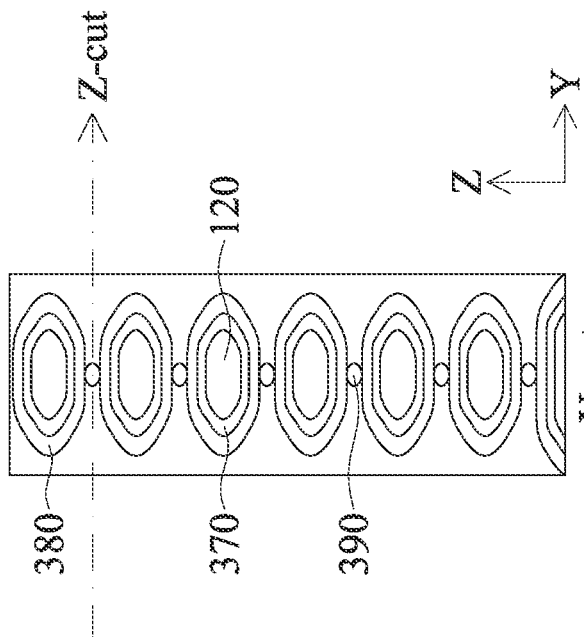
FIG. 15C Y-cut
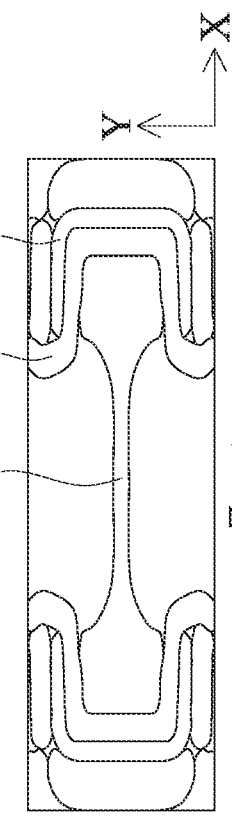
FIG. 15D Z-cut
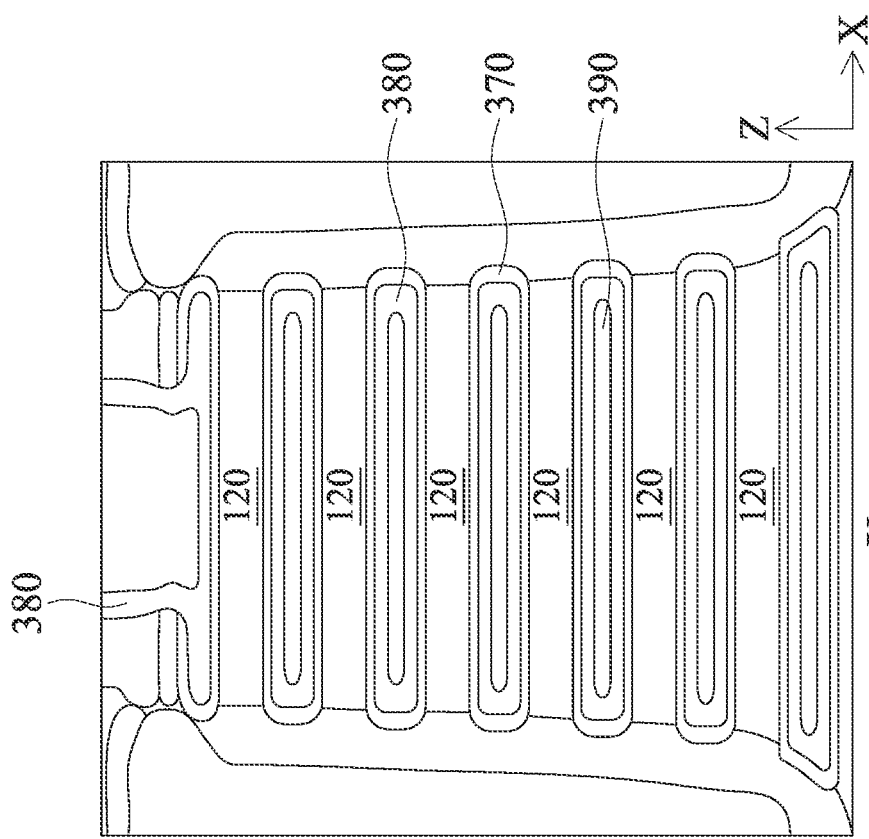
FIG. 15B X-cut

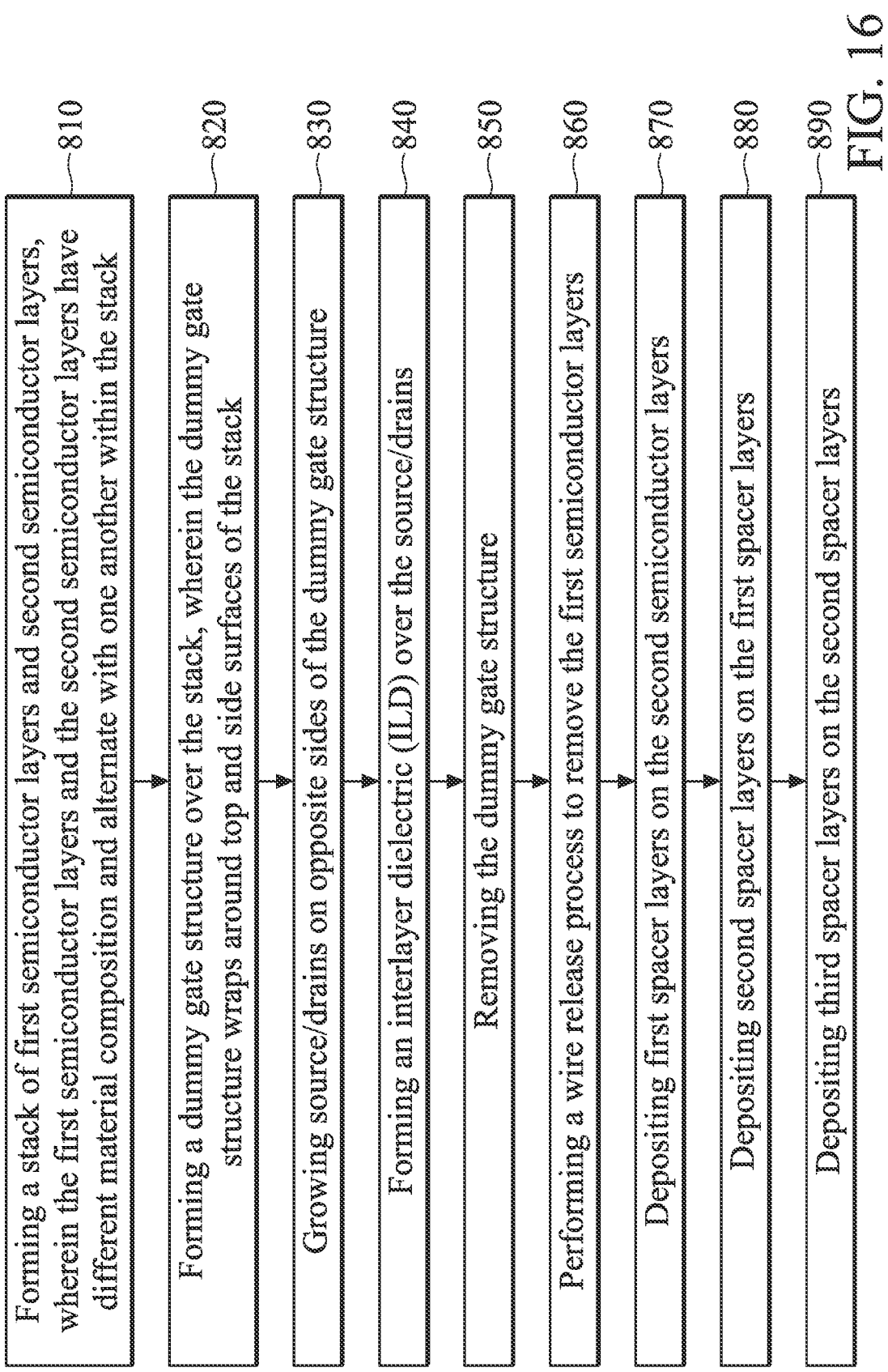

REDUCING PARASITIC CAPACITANCE FOR GATE-ALL-AROUND DEVICE BY FORMING EXTRA INNER SPACERS

PRIORITY DATA

The present application is a continuation of U.S. patent application Ser. No. 17/379,208 filed on Jul. 19, 2021 entitled "Reducing Parasitic Capacitance for Gate-All-Around Device By Forming Extra Inner Spacers" which is a divisional application of U.S. patent application Ser. No. 16/446,312, filed on Jun. 19, 2019 entitled "Reducing Parasitic Capacitance For Gate-All-Around Device By Forming Extra Inner Spacers" issued on Jul. 20, 2021 as U.S. Pat. No. 11,069,793, which is a utility patent application of U.S. Provisional Patent Application No. 62/738,121, filed on Sep. 28, 2018, entitled "Method And Device Of Forming Inner Spacers For Gate All Around Device", each of which are hereby incorporated herein by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides. The HGAA transistors are compatible with conventional complementary metal-oxide-semiconductor (CMOS) processes, allowing them to be aggressively scaled down while maintaining gate control and mitigating SCEs. However, conventional HGAA devices may have an excessive parasitic capacitance between the gate and the source/drain, which could adversely degrade device performance.

Therefore, although conventional HGAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-11A are three-dimensional (3D) perspective views of a semiconductor structure at various stages of fabrication according to various aspects of the present disclosure.

FIGS. 7B-15B are X-cut cross-sectional side views of a semiconductor structure at various stages of fabrication according to various aspects of the present disclosure.

FIGS. 7C-15C are Y-cut cross-sectional side views of a semiconductor structure at various stages of fabrication according to various aspects of the present disclosure.

FIGS. 7D-15D are Z-cut cross-sectional top or planar views of a semiconductor structure at various stages of fabrication according to various aspects of the present disclosure.

FIG. 16 is a flowchart illustrating a method of fabricating a semiconductor structure according to various aspects of the present disclosure.

DETAILED DESCRIPTION

Figure 1A:
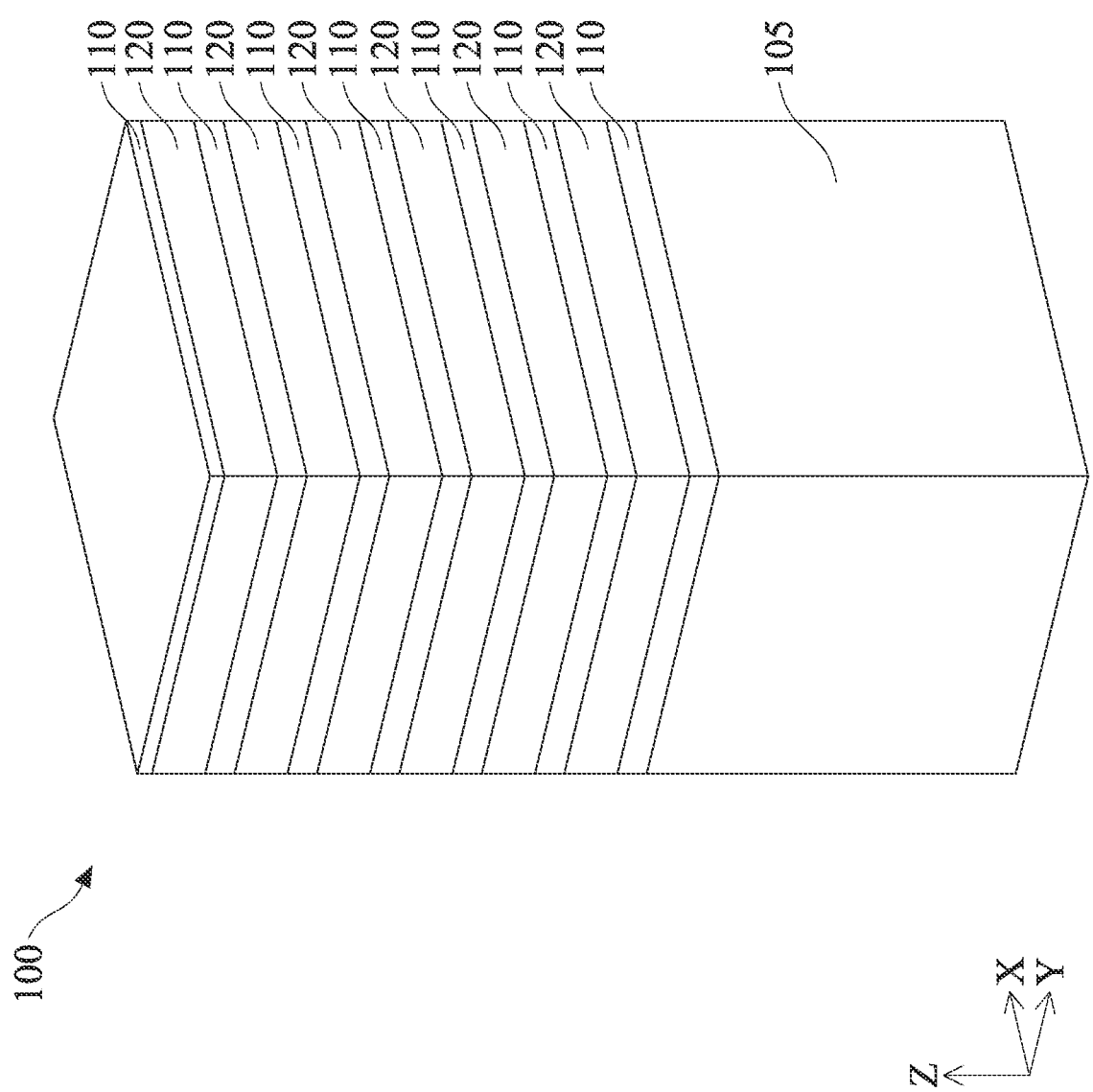

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to gate-all-around (GAA) devices. A GAA device includes any device that has its gate structure, or portions thereof, formed on four-sides of a channel region (e.g., surrounding a portion of a channel region). The channel region of a GAA device may include nanostructures such as nanowire channels, bar-shaped channels, and/or other suitable channel configurations. In embodiments, the channel region of a GAA device may have multiple horizontal nanowires or horizontal bars vertically spaced, making the GAA device a stacked horizontal GAA (S-HGAA) device. The GAA devices presented herein may include p-type metal-oxide-semiconductor GAA devices or n-type metal-oxide-semiconductor GAA devices. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1A-11A are three-dimensional (3D) perspective views of a semiconductor device 100 at various stages of fabrication according to various aspects of the present disclosure. FIGS. 7B-11B are X-cut cross-sectional side views of the semiconductor device 100 at various stages of fabrication according to various aspects of the present disclosure. FIGS. 7C-11C are Y-cut cross-sectional side views of the semiconductor device 100 at various stages of fabrication according to various aspects of the present disclosure. FIGS. 7D-11D are Z-cut cross-sectional top or planar views of the semiconductor device 100 at various stages of fabrication according to various aspects of the present disclosure.

In the illustrated embodiments, the semiconductor device 100 includes a GAA device (e.g., an HGAA device). The GAA device may be fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1A, The semiconductor device 100 includes a substrate 105. In some embodiments, the substrate 105 contains a semiconductive material, for example silicon. A plurality of semiconductor layers 110 and 120 are vertically stacked (along a "Z" direction shown in FIG. 1A) over the substrate 105 in an interleaving or alternating fashion. For example, a semiconductor layer 110 is disposed over the substrate 105, a semiconductor layer 120 is disposed over the semiconductor layer 110, and another semiconductor layer 110 is disposed over the semiconductor layer 120, so on and so forth. The material compositions of the semiconductor layers 120 and 110 are configured such that they have an etching selectivity in a subsequent etching process discussed in more detail below. For example, in some embodiments, the semiconductor layers 110 contains silicon germanium (SiGe), while the semiconductor layers 120 contain silicon (Si). In some other embodiments, the semiconductor layers 120 contain SiGe, while the semiconductor layers 110 contain Si.

Figure 2A:
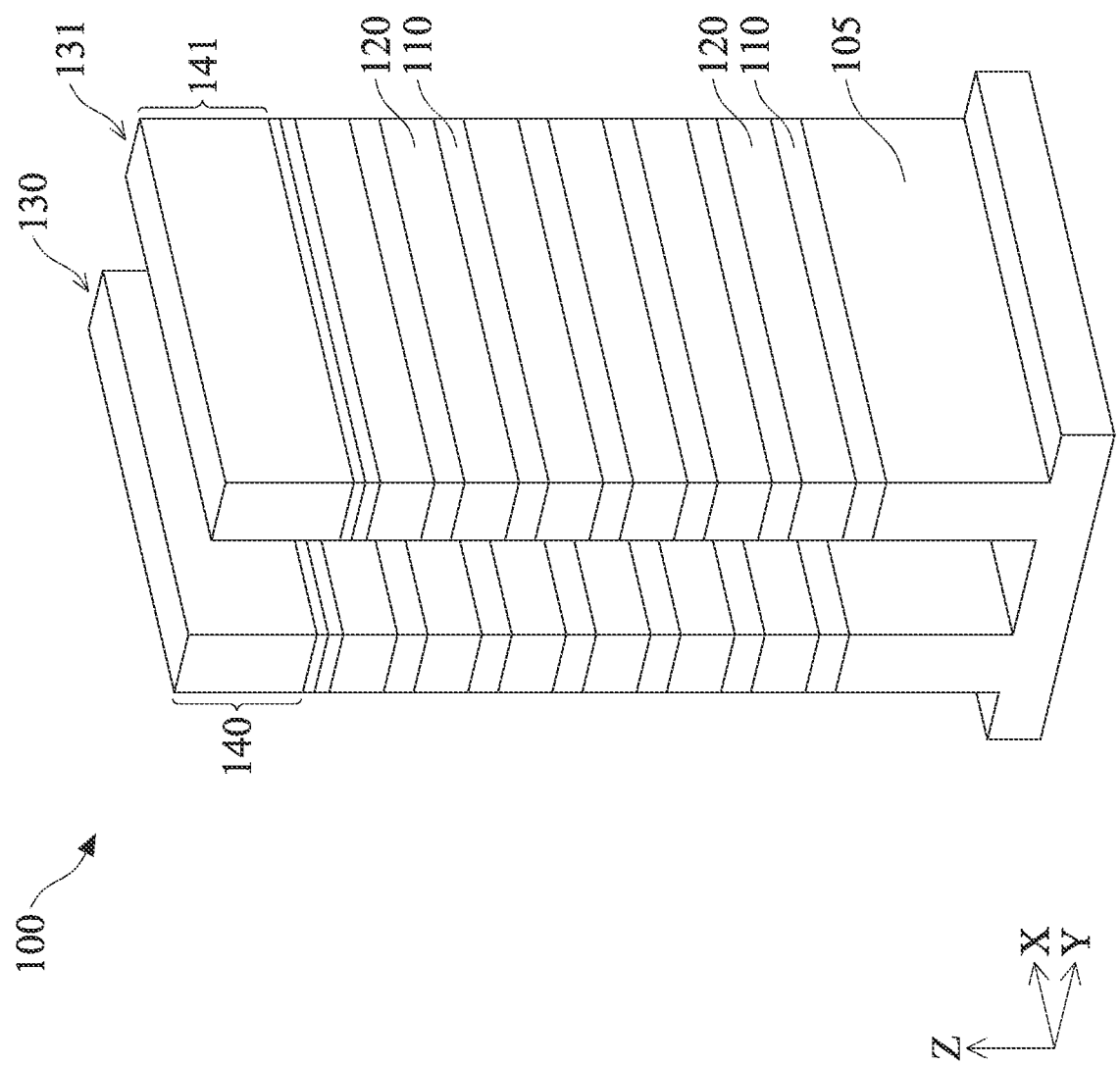

Referring now to FIG. 2A, one or more etching processes are performed to the semiconductor device 100 to pattern the stack of semiconductor layers 110 and 120 into a plurality of fin structures, for example into fin structures 130 and 131. Each of the fin structures 130-131 includes a stack of the semiconductor layers 110 and 120, where the semiconductor layers 110 and 120 are disposed in an alternating manner with respect to one another. The fin structures 130 and 131 each extend horizontally in an X-direction and are separated from each other horizontally in a Y-direction, as shown in FIG. 2A. The patterning may be performed using etching mask layers 140 and 141, for example. The etching masks 140 and 141 may each contain a plurality of dielectric layers. Note that the etching processes performed to etch the fins 130-131 into place may also etch away portions of the substrate 105. In other words, the substrate 105 is recessed vertically in the Z-direction. It is understood that the X-direction and the Y-direction are horizontal directions that are perpendicular to each other, and that the Z-direction is a vertical direction that is orthogonal to a horizontal plane defined by the first direction and the second direction.

Figure 3A:
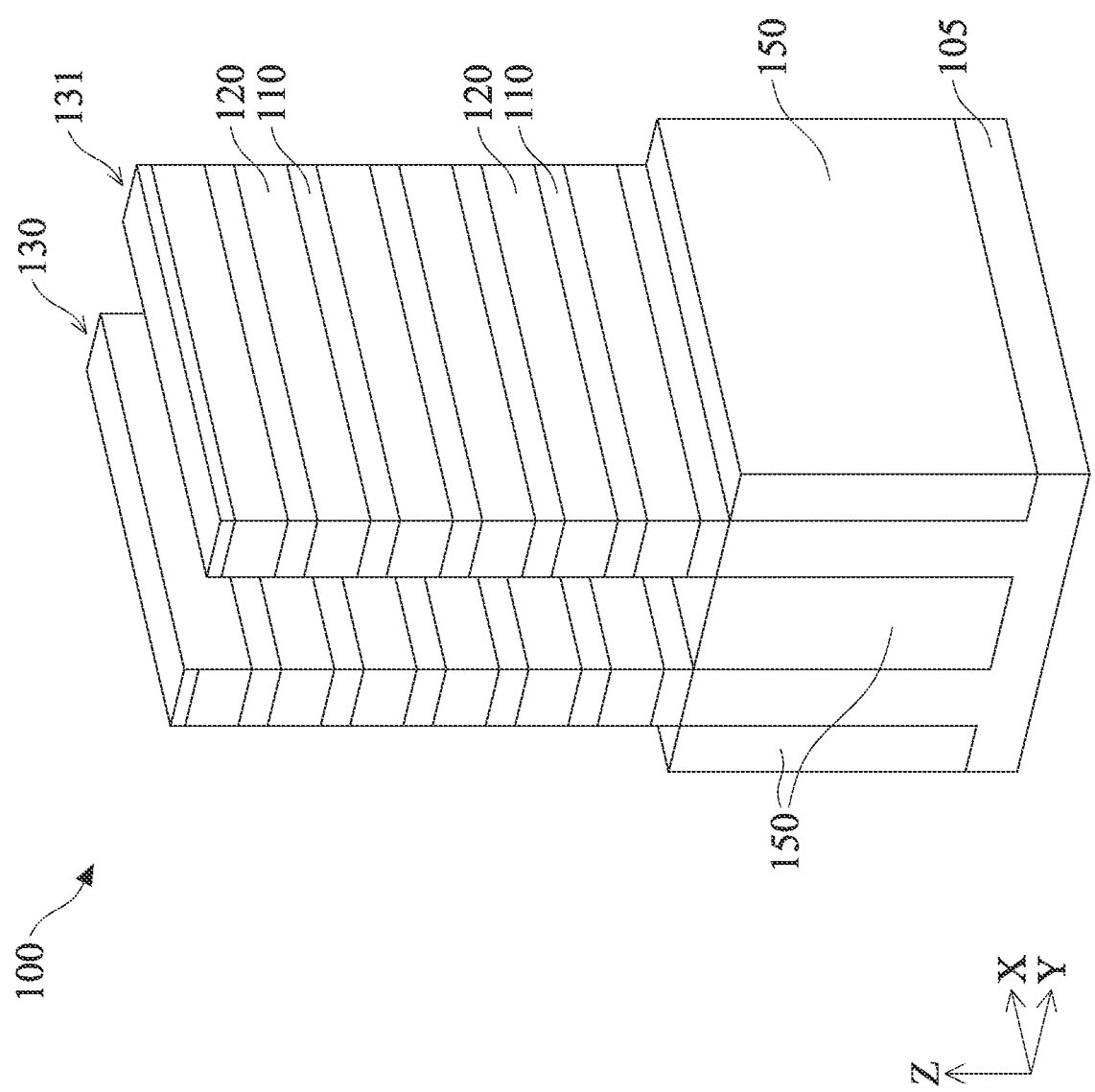

Referring now to FIG. 3A, isolation structures 150 are formed, for example in place of the removed substrate 105. In other words, the fin structures 130-131 are located above a plane defined by upper surfaces of the isolation structures 150 and the remaining portions of the substrate 105. In some embodiments, the isolation structures 150 includes shallow trench isolation (STI). The isolation structure 150 may contain an electrically insulating material such as silicon oxide.

Figure 4A:
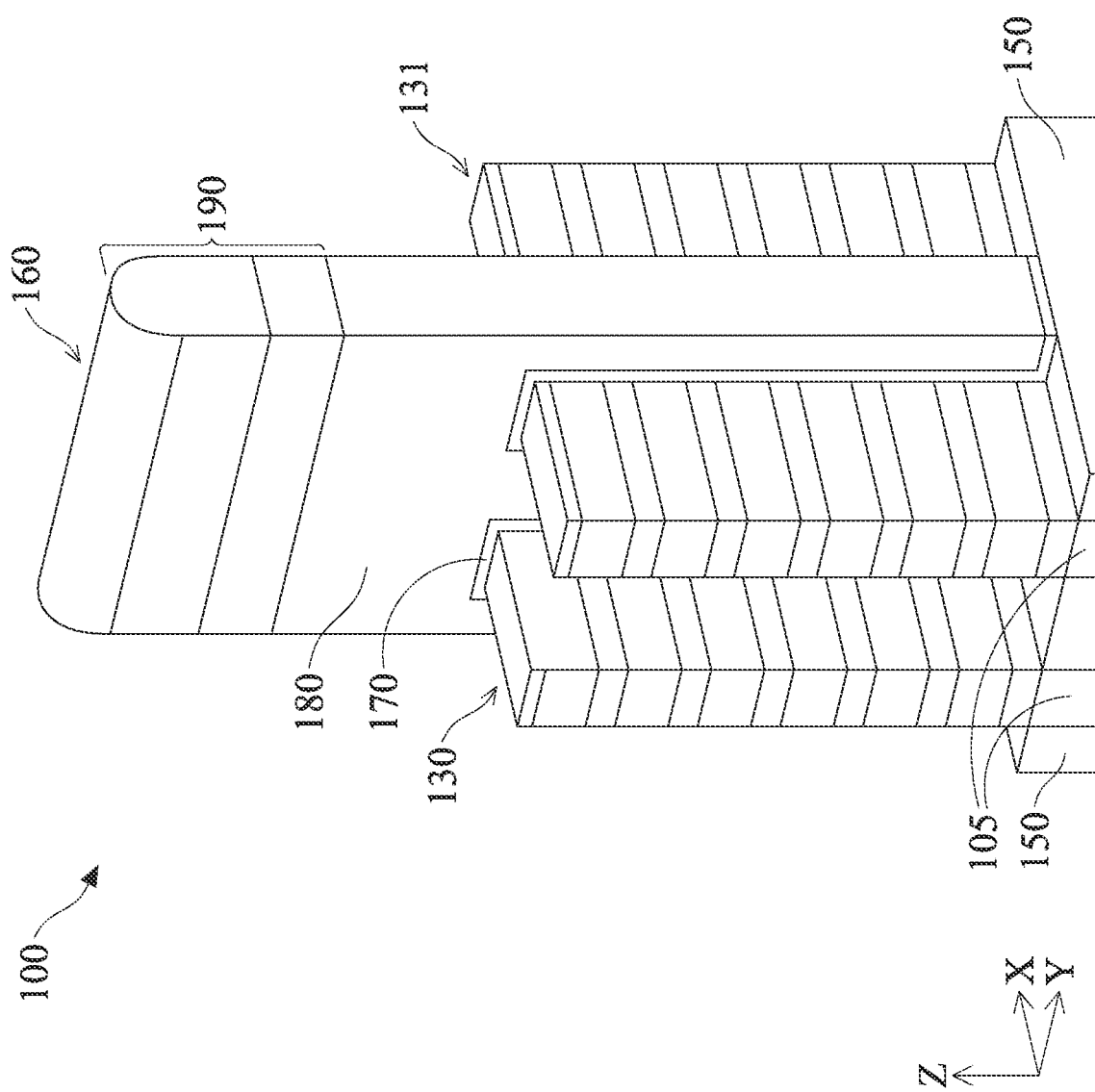

Referring now to FIG. 4A, a dummy gate structure 160 is formed over a portion of each of the fin structures 130-131. The dummy gate structure 160 wraps around the top surfaces and side surfaces of each of the fin structures. The dummy gate structure 160 includes a gate dielectric layer 170. In some embodiments, the gate dielectric layer 170 contains silicon oxide. In other embodiments, the gate dielectric layer 170 contains a high-k dielectric material. A high-k dielectric material is a material having a dielectric constant that is greater than a dielectric constant of $SiO_2$, which is approximately 4. For example, the high-k gate dielectric includes hafnium oxide ($HfO_2$), which has a dielectric constant that is in a range from about 18 to about 40. As various other examples, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The dummy gate structure 160 also includes a dummy gate electrode layer 180 that is formed over the gate dielectric layer 170. In some embodiments, the dummy gate electrode layer 180 contains polysilicon.

The dummy gate structure 160 may also include one or more mask layers 190, which are used to pattern the gate dielectric layer 170 and the dummy gate electrode layer 180. For example, a dielectric layer may be formed over the fin structures 130-131, and a polysilicon layer may be formed over the dielectric layer. The mask layers 190 may be patterned by a patterned photoresist layer, and then the mask layers 190 may be used to pattern the polysilicon layer and the dielectric layer below in order to form the gate dielectric layer 170 and the dummy gate electrode layer 180 of the dummy gate structure 160. The dummy gate structure 160 may undergo a gate replacement process through subsequent processing to form a high-k metal gate, as discussed in greater detail below.

Figure 5A:
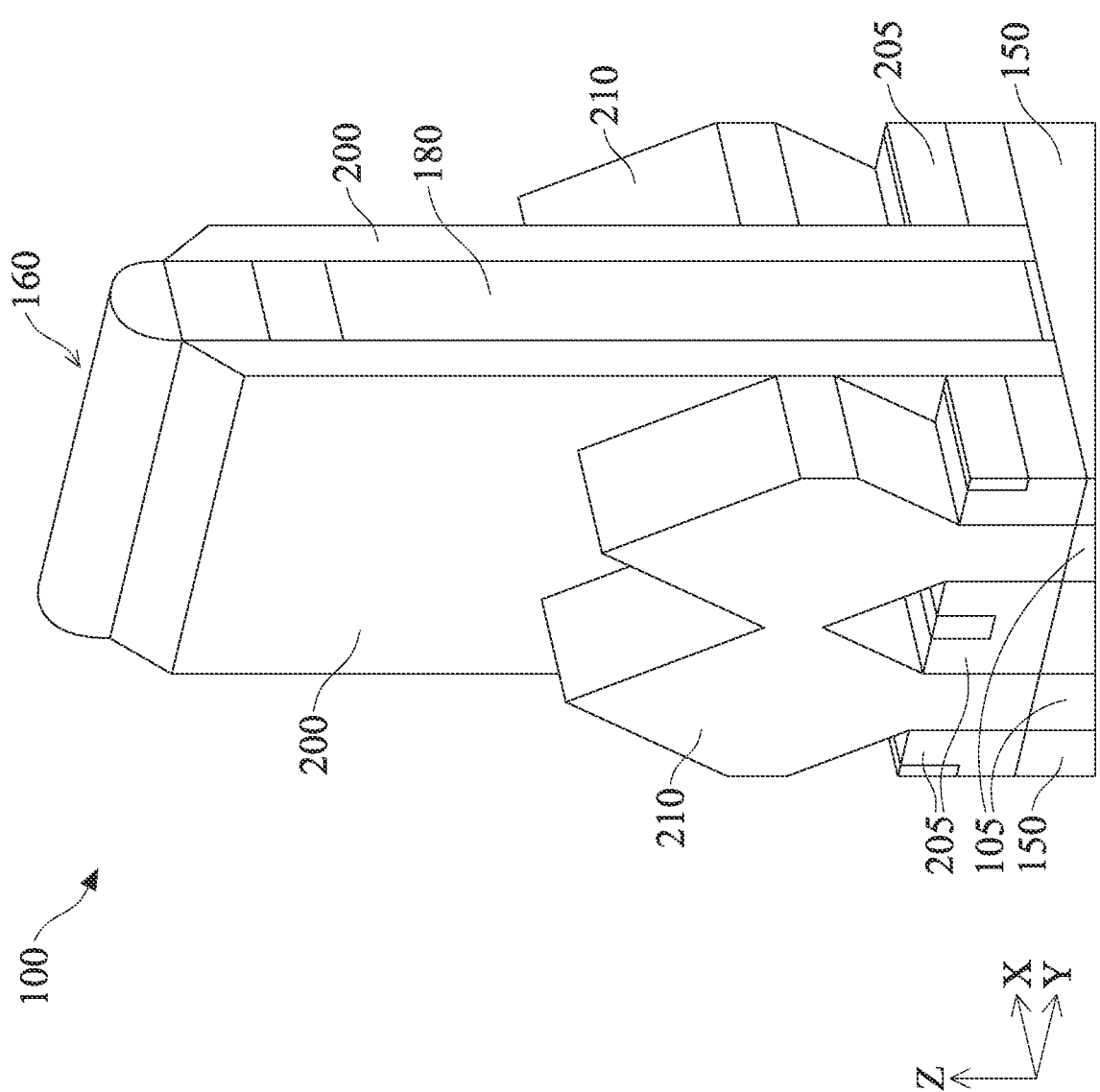

Referring now to FIG. 5A, gate spacers 200 may be formed on sidewalls of the dummy gate structure 160. The gate spacers 200 contain a dielectric material, for example silicon nitride, silicon oxide, silicon carbide, silicon oxycarbide (SiOC), silicon oxycarbon nitride (SiOCN), a low-k dielectric material, or a combination thereof. The gate spacers 200 may include a single layer or a multi-layer structure. In some embodiments, the gate spacers 200 have a thickness in a range of a few nanometers (nm). In some embodiments, the gate spacers 200 may be formed by depositing a spacer layer (containing a dielectric material) over the dummy gate structure 160, followed by an anisotropic etching process to remove portions of the spacer layer from a top surface of the dummy gate structure 160. After the etching, portions of the spacer layer substantially remain on the sidewall surfaces of the dummy gate structure 160 and become the gate spacers 200. In some embodiments, the anisotropic etching process is a dry (e.g., plasma) etching process. It is understood that the formation of the gate spacers 200 may also involve chemical oxidation, thermal oxidation, atomic layer deposition (ALD), chemical vapor deposition (CVD), and/or other suitable methods.

In addition, portions of the fin structures 130-131 outside of the dummy gate structure 160 may be etched away (but portions of the fin structures 130-131 underneath the dummy gate structure 160 still remain). Source/drain spacers 205 are also formed over the isolation structure 150. The source/drain spacers 205 may include a low-k dielectric material. Epi-layers 210 are formed, for example through an epitaxial growth process. The epi-layers 210 may be grown on the substrate 105 and may merge together above the source/drain spacers 205, as is shown in FIG. 5A. The epi-layers 210 may serve as the source/drain regions of the semiconductor device 100.

Figure 6A:
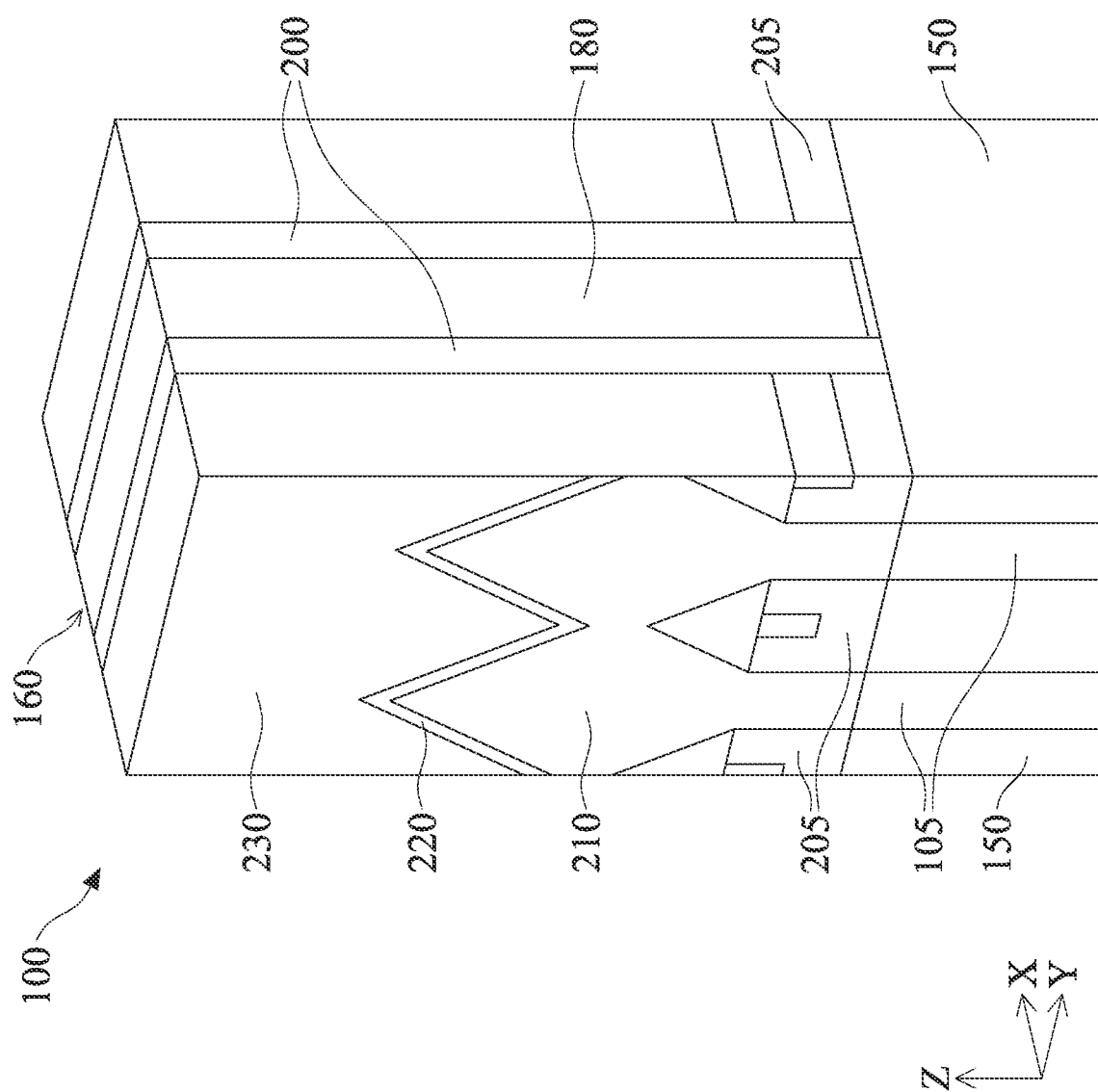

Referring now to FIG. 6A, a contact etching-stop layer 220 is formed on the upper surfaces of the epi-layers 210. The contact etching-stop layer 220 may include a dielectric material and may be used to stop etching during source/drain contact formation, for example when a source/drain contact trench is etched. An interlayer dielectric (ILD) 230 is formed over the epi-layers 210 (and over the etching-stop layer 220). The ILD 230 may include a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD 230 may include silicon oxide or silicon nitride, or combinations thereof. Among other things, the ILD 230 provides electrical isolation between the various components of the semiconductor device 100.

Figure 7A:
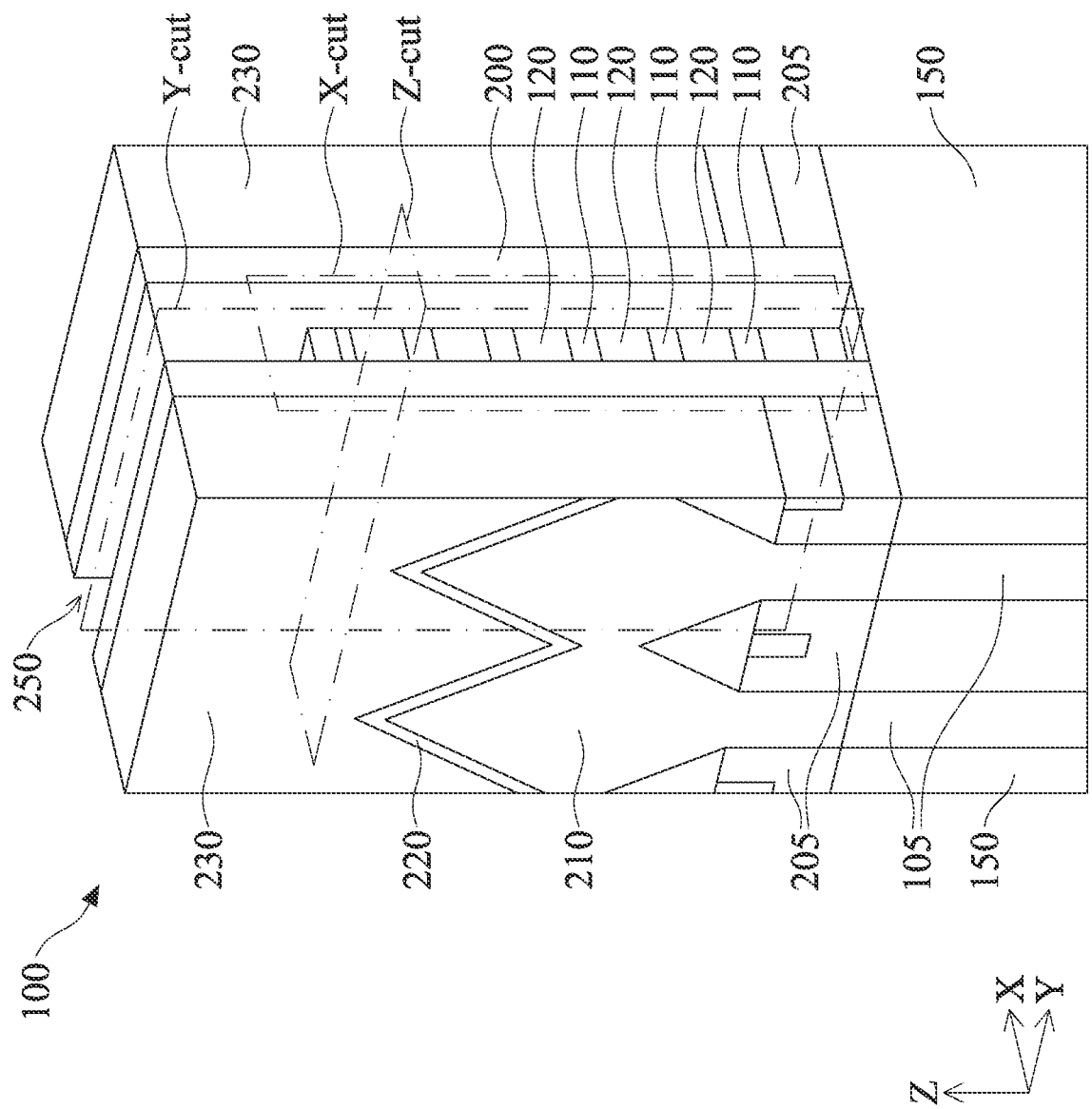
Figure 8A:
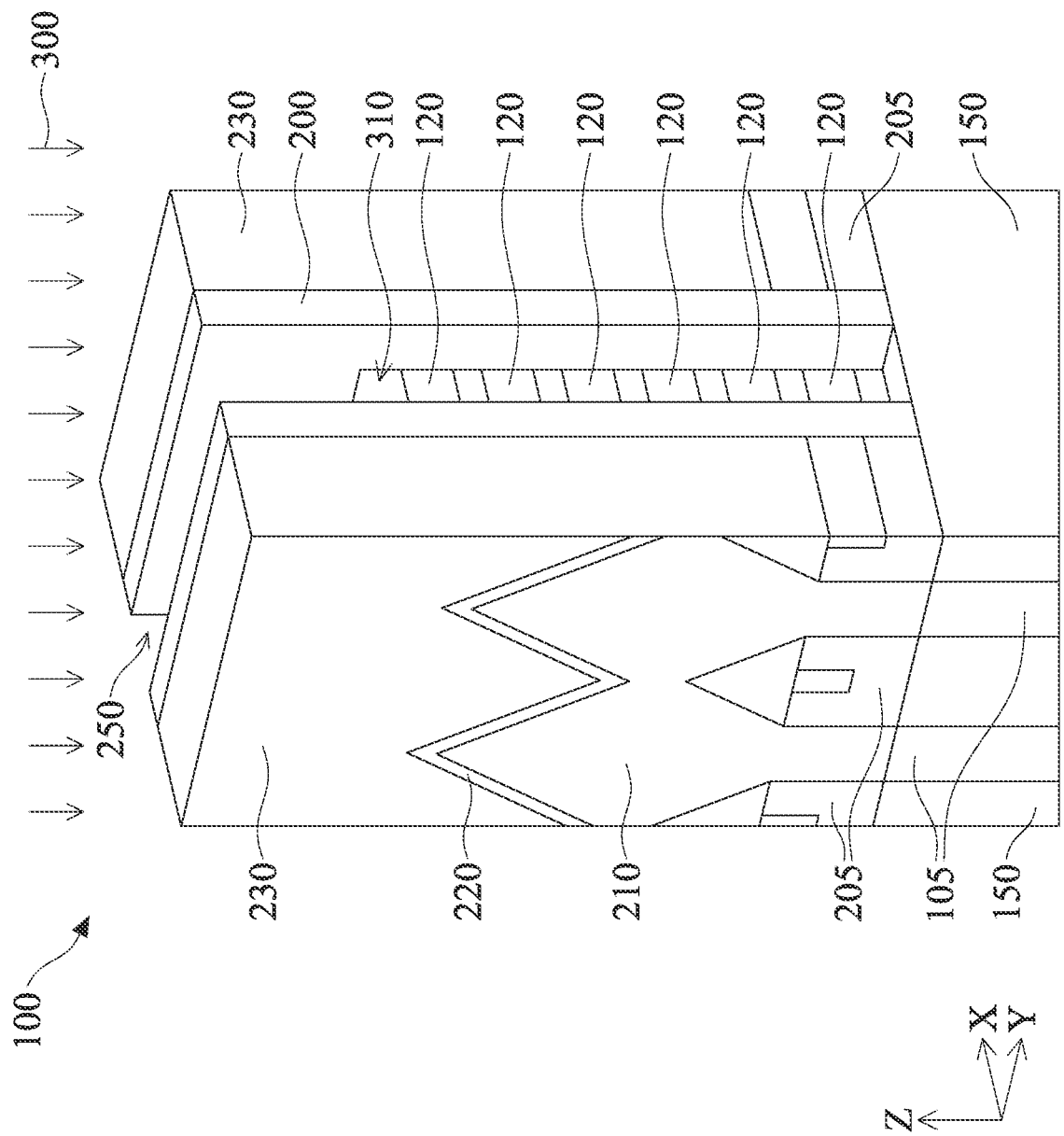

Referring now to FIGS. 7A, 7B, 7C, and 7D, the dummy gate structure 160 is removed. In more detail, FIG. 7A illustrates a perspective three-dimensional view of the semiconductor device 100. FIG. 7B illustrates an X-cut of the semiconductor device 100, where the X-cut is taken along an X-Z plane (shown in FIG. 7A). FIG. 7C illustrates a Y-cut of the semiconductor device 100, where the Y-cut is taken along a Y-Z plane (shown in FIG. 7A). FIG. 7D illustrates a Z-cut of the semiconductor device 100, where the Z-cut is taken along an X-Y plane (shown in FIG. 7A). In other words, FIGS. 7B-7C (i.e., the X-cut and the Y-cut) are cross-sectional side views of the semiconductor device 100, while FIG. 7D is a cross-sectional top view or planar view of the semiconductor device 100. However, it is understood that the Z-cut does not illustrate just the layers on a single X-Y plane, but that it shows the superposition of a plurality of layers, so as to better illustrate the concepts of the present disclosure.

The removal of the dummy gate structure 160 forms a recess 250 in the semiconductor device 100. The recess 250 partially exposes the top and side surfaces of the fin structures 130 and 131.

Referring now to FIGS. 8A, 8B, 8C, and 8D, a wire release process 300 is performed to the semiconductor device 100. The wire release process 300 may include one or more etching processes to remove the semiconductor layers 110, but not the semiconductor layers 120. As discussed above, this is made possible due to the different material compositions between the semiconductor layers 110 and 120. In other words, there is an etching selectivity between the semiconductor layers 110 and 120 as the wire release process 300 is performed. For example, the semiconductor layers 110 may be etched away at a substantially faster rate (e.g., 10 times or more) than the second semiconductor layers 120.

The removal of the semiconductor layers 110 leaves voids or gaps 310 in the semiconductor device 100. The voids or gaps 310 are disposed around the semiconductor layers 120. Thus, each of the semiconductor layers 120 is circumferentially exposed. The wire release process 300 may also reshape the semiconductor layers 120. For example, the wire release process 300 may cause each of the semiconductor layers 120 to have a more rounded or curved profile. This is not only shown in the 3-D perspective view of FIG. 8A, but is more clearly illustrated in the cross-sectional view of FIG. 8C (i.e., the Y-cut), where the cross-sectional profile of each of the semiconductor layers 120 resembles an ellipsoid or an oval. The semiconductor layers 120 may also be interchangeably referred to as "wires" hereinafter. It is understood that these "wires" 120 may serve as the channel regions of the semiconductor device 100.

Referring now to FIGS. 9A, 9B, 9C, and 9D, one or more spacer deposition processes 350 are performed to the semiconductor device 100. The spacer deposition process 350 forms multiple layers of spacers using processes such as CVD, physical vapor deposition (PVD), plasma enhanced CVD (PECVD), metal-organic CVD (MOCVD), ALD, or combinations thereof. These multiple layers of spacers at least partially fill the voids or gaps 310 left by the removal of the semiconductor layers 110.

Figure 9A:
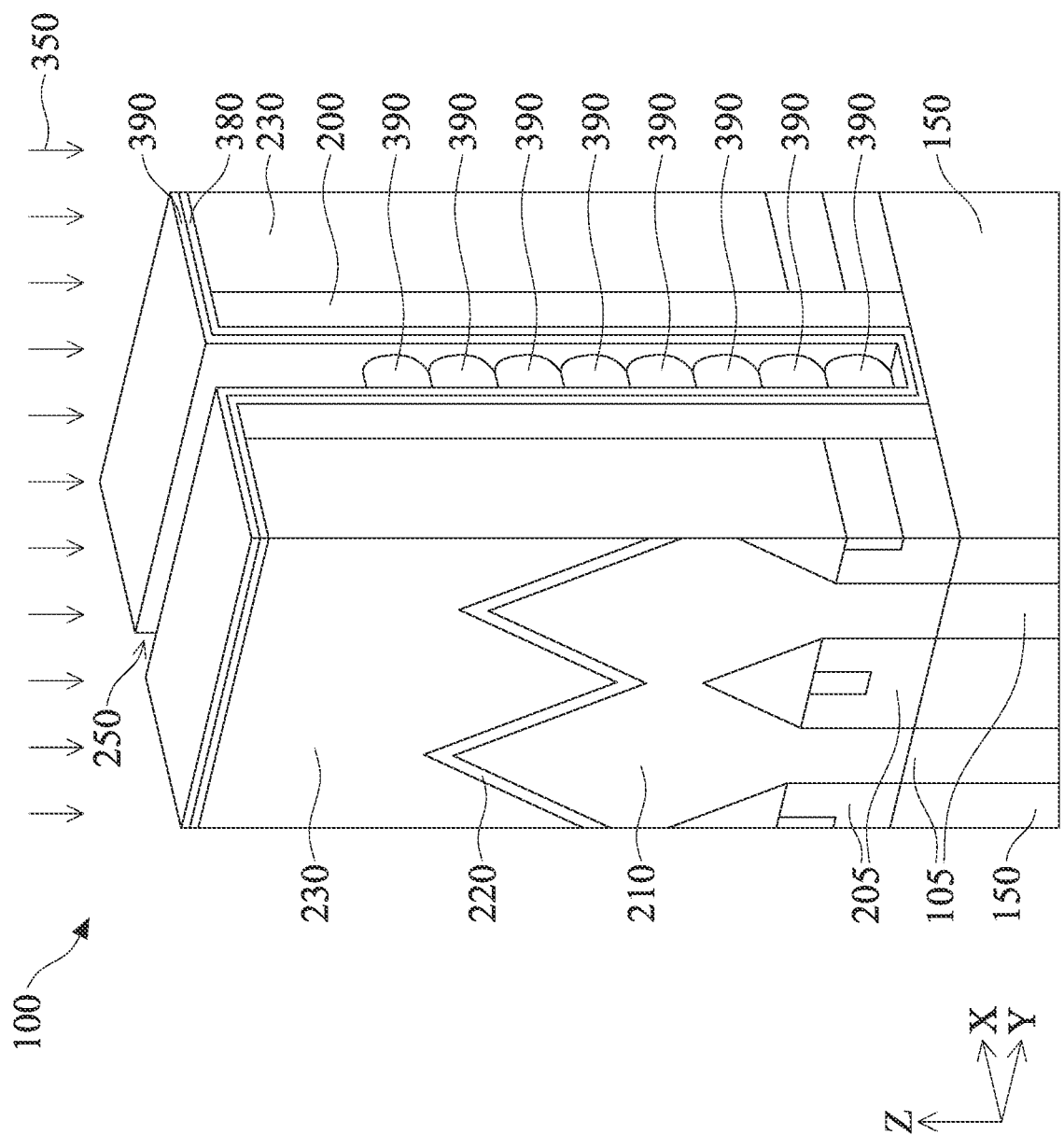
Figure 10A:
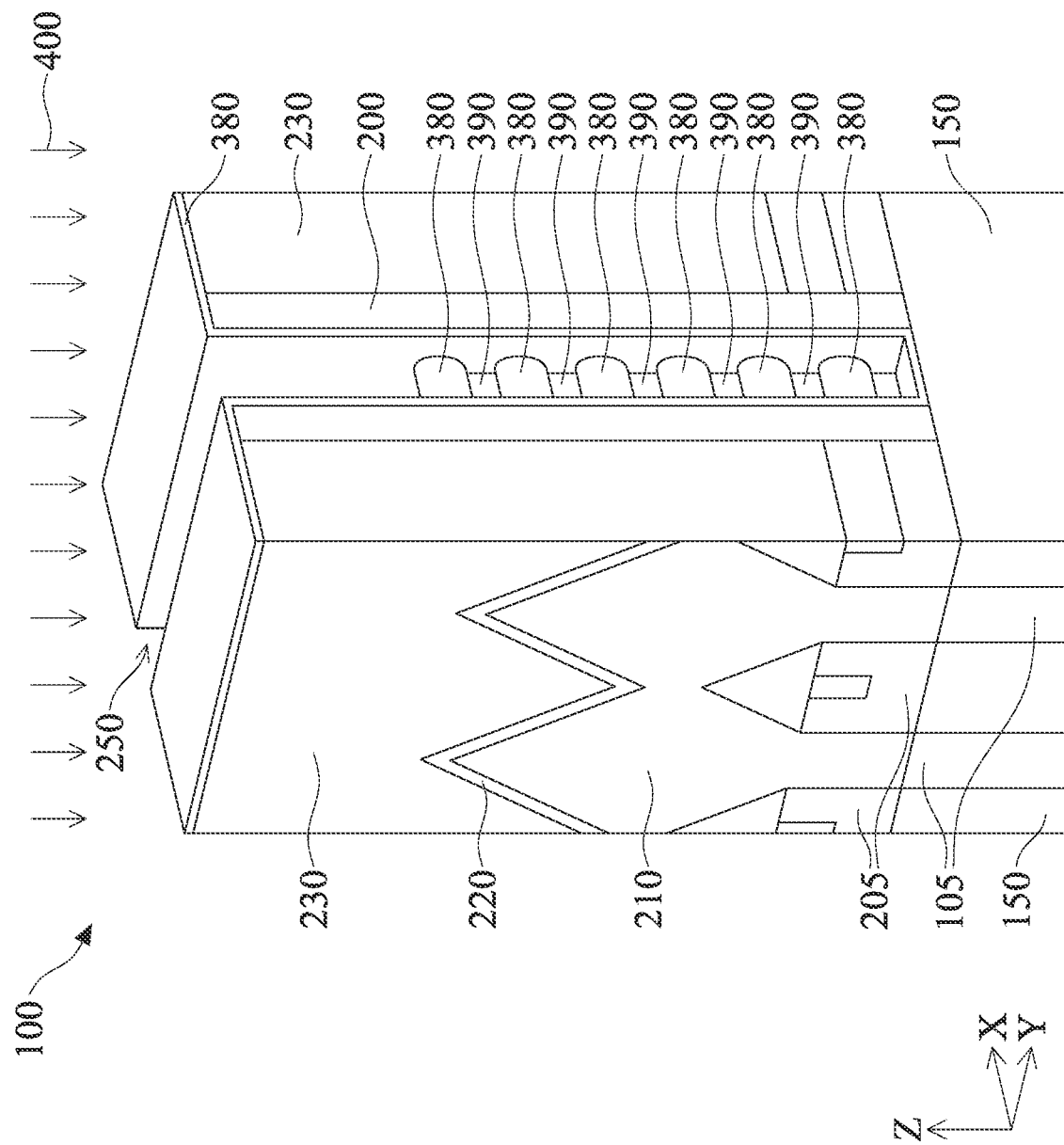

For example, as shown in FIGS. 9A-9D, a spacer layer 370 is formed around the outer surfaces of the wires 120. As more clearly shown in the Y-cut cross-sectional view of FIG. 9C, the spacer layer 370 circumferentially wraps around each of the wires 120 in 360 degrees. In some embodiments, the spacer layer 370 may include a suitable dielectric material and may serve as an interfacial layer (IL), similar to the interfacial layers between the channel region and the gate structure for conventional transistors. In some embodiments, the spacer layer 370 includes an oxide material, for example silicon oxide. Also as shown in FIG. 9B and FIG. 9D, the spacer layers 370 are formed to be in direct contact with sidewalls of the epi-layers 210.

A spacer layer 380 is formed on the spacer layer 370. In some embodiments, the spacer layer 380 contains a high-k dielectric material, which as discussed above may include a material having a dielectric constant that is greater than a dielectric constant of $SiO_2$. In various embodiments, the spacer layer 380 may contain $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. As clearly shown in the Y-cut cross-sectional view of FIG. 9C, the spacer layer 380 circumferentially wraps around each of the spacer layers 370 in 360 degrees. Also as shown in the 3-D perspective view of FIG. 9A and the X-cut cross-sectional view of FIG. 9B, portions of the spacer layer 380 are disposed on the sidewalls of the gate spacers 200. It is understood that the spacer layer 370 may serve a role similar to the high-k gate dielectric layer in conventional transistors.

A spacer layer 390 is formed on the spacer layer 380. The spacer layer 390 has a different material composition than the spacer layer 380. In some other embodiments, the spacer layer 390 has a lower dielectric constant than the spacer layer 380. For example, the spacer layer 390 may include a low-k material (e.g., a material having a dielectric constant smaller than a dielectric constant of silicon oxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. The implementation of the spacer layer 390 is one of the novel aspects of the present disclosure, as it does not exist in conventional GAA devices. The spacer layer 390 helps reduce parasitic capacitance, for example a parasitic capacitance in a alternating current (AC) context, as discussed in more detail below.

As clearly shown in the Y-cut cross-sectional view of FIG. 9C, the spacer layer 390 circumferentially wraps around each of the spacer layers 380 in 360 degrees. In addition, the spacer layer 390 wrapped around adjacent spacer layers 380 are merged together. Also as shown in the 3-D perspective view of FIG. 9A and the X-cut cross-sectional view of FIG. 9B, portions of the spacer layer 390 are disposed on the sidewalls of the spacer layers 380. Furthermore, as shown in the Z-cut cross-sectional top view of FIG. 9D, the spacer layer 390 may form a "bridge" that extends in the X-direction, where the "bridge" is separated from the epi-layers 210 by portions of the spacer layers 370 and 380. Such a "bridge" formed by the spacer layer 390 is not a feature that exists in conventional GAA devices. As discussed in further detail below, this "bridge" formed by the spacer layer 390—which contains a low-k dielectric material—effectively increases a thickness of a dielectric material in a parasitic capacitor, which then helps to lower the parasitic capacitance of the semiconductor device 100.

Referring now to FIGS. 10A, 10B, 10C, and 10D, a spacer etching process 400 is performed to the semiconductor device 100. In some embodiments, the spacer etching process 400 includes a wet etching process. Due to the differences in material compositions between the spacer layer 390 and the spacer layer 380, there is an etching selectivity between the spacer layer 390 and the spacer layer 380. As such, the spacer etching process 400 is configured to partially etch away the spacer layer 390, which exposes most of the surfaces of the spacer layer 380. A majority of the spacer layer 390 is removed, and the remaining portions of the spacer layer 390 are portions that are disposed between the spacer layers 380, as more clearly shown in the Y-cut cross-sectional view of FIG. 10C.

Referring now to FIGS. 11A, 11B, 11C, and 11D, a metal gate formation process 500 is performed to the semiconductor device 100. The metal gate formation process 500 forms a metal gate structure 510 in the recess 250. In some embodiments, the metal gate structure 510 includes a metal gate electrode. The metal gate electrode may include a work function metal layer. The work function metal layer may include work function metals configured to tune a work function of a transistor. The work function metal layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by ALD. CVD, PVD, and/or other suitable process.

The metal gate electrode may further include a fill metal layer that is formed over the work function metal layer. The fill metal layer may serve as the main electrically conductive portion of the metal gate electrode. The fill metal layer may include aluminum, tungsten, cobalt, copper, and/or other suitable materials, and may be formed by ALD, CVD. PVD, plating, and/or other suitable processes. It is understood that a planarization process such as a chemical mechanical polishing (CMP) process may be performed following the deposition of the metal gate electrode.

Figure 11A:
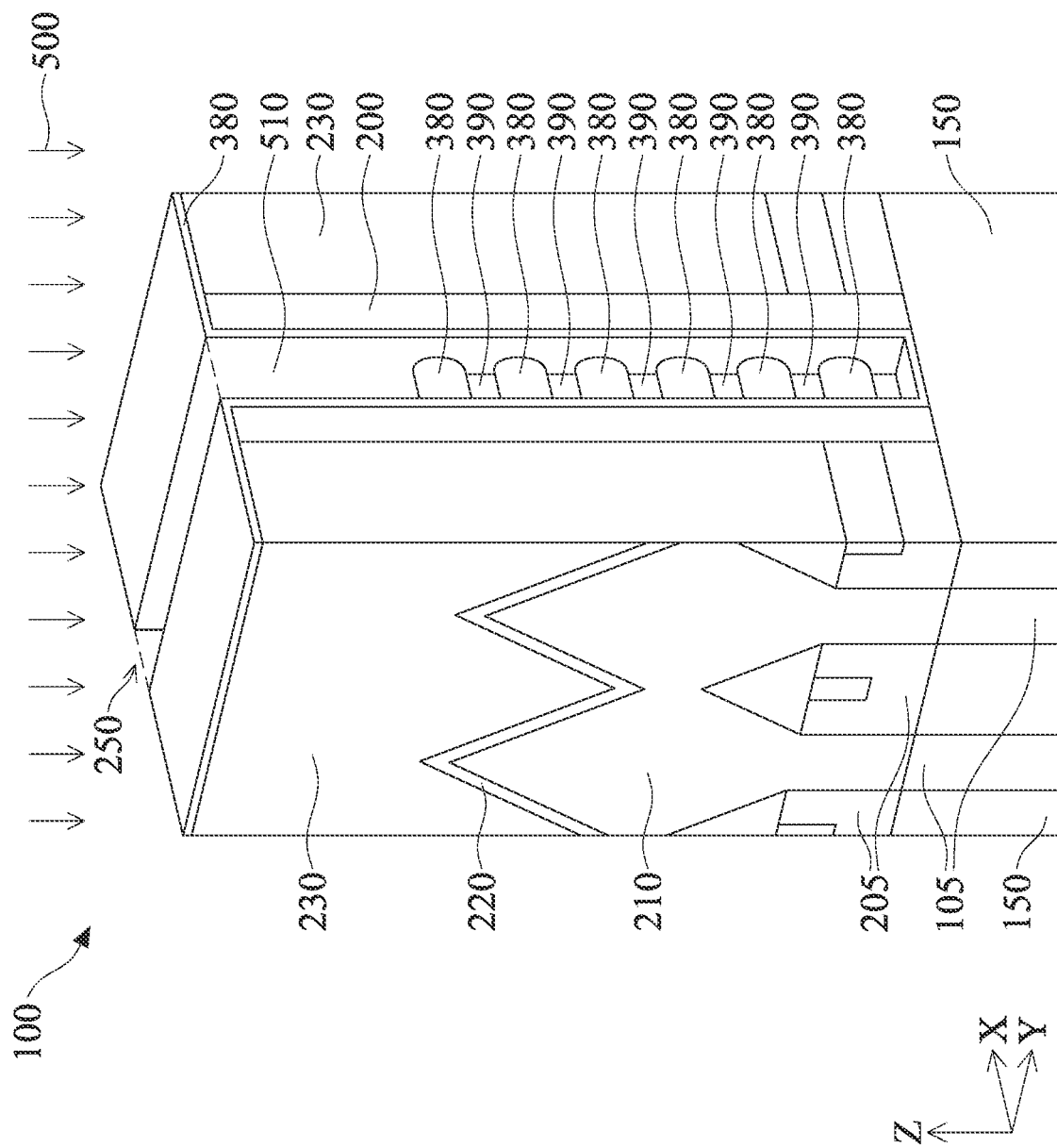

Note that although the metal gate structure 510 is clearly illustrated in FIGS. 11B-11D, it is illustrated as a mostly transparent structure in FIG. 11A, so as to more clearly illustrate the various components that the metal gate structure 510 is formed over.

As shown in the Y-cut cross-sectional view of FIG. 11C, the metal gate structure 510 is formed to surround the spacer layers 370, 380, 390 and the wires 120, where the wires themselves are circumferentially surrounded by the spacer layers 370, respectively. Had the spacer layer 390 not been formed, then the regions they occupy could have been replaced by the metal gate structures instead, which could increase parasitic capacitance. In more detail, had the spacer layer 390 not been formed, the metal gate structure 510 and the source/drain regions (i.e., the epi-layers) 210 would have been separated by just the spacer layers 370 and 380 (see the top view of FIG. 11D). Generally, a capacitor is formed when a dielectric material is disposed between two conductive plates. Here, parasitic capacitance may arise due to the metal gate structure 510 and the epi-layers 210 behaving as the two conductive plates, and the spacer layers 370-380 behaving as the dielectric material disposed between the two conductors. Capacitance may be calculated by the following equation:

$$C = \varepsilon * A/d$$

where "C" represents capacitance, "ε" represents the dielectric constant (also referred to as permittivity) of the dielectric material, "A" represents the area of the conductive plates, and "d" represents the distance between the conductive plates (i.e., the thickness of the dielectric material).

Based on the capacitance equation, it can be seen that the parasitic capacitance of the semiconductor device 100 herein is inversely correlated with the thickness of spacer layers. Had the spacer layer 390 not been formed, the combined thickness of the spacer layers 370 and 380 may still be too thin, thereby raising the value of the parasitic capacitance. Parasitic capacitance may become an even greater concern in an AC context, for example in high frequency (e.g., radio frequency, or RF) devices, since the operational speed of transistors may be slowed down as the parasitic capacitance increases.

Here, the implementation of the spacer layer 390 effectively "thickens" the distance "d" in the parasitic capacitance calculations, since the metal gate structure 510 is now separated from the source/drain regions (i.e., the epi-layers 210) by not just the spacer layers 370-380, but also by the spacer layer 390. The increase in the distance d lowers the parasitic capacitance. In addition, the spacer layer 390 is specifically configured to have a low-k dielectric constant, which also helps to reduce the overall parasitic capacitance (since at least the spacer layer 380 has a high dielectric constant).

There are several distinct physical characteristics associated with the semiconductor device 100 due to the unique fabrication process flow of the present disclosure. For example, as shown in the Y-cut cross-sectional side view of FIG. 11C, each of the wires 120 may have a lateral dimension 550 that is measured in the Y-direction. In embodiments where the wires 120 are substantially round or circular, the lateral dimension 550 may be considered a diameter of each of the wires 120.

Meanwhile, each of the spacer layers 390 that are located between adjacent pairs of the spacer layers 380 may have a lateral dimension 560 that is also measured in the Y-direction. According to the various aspects of the present disclosure, the lateral dimension 560 is substantially smaller than the lateral dimension 550. In some embodiments, the lateral dimension 560 is in a range between about 0.5 nanometers and about 8 nanometers. The fact that the lateral dimension 560 is smaller than the lateral dimension 550, along with the value range of the lateral dimension 560, are specifically configured to ensure that there is a sufficient amount of the spacer layers 390 to accomplish the parasitic capacitance reduction, while not having too much of the spacer layers 390 such that they will interfere with the intended transistor operation of the semiconductor device 100, because the spacer layers 390 are not meant to be a part of the gate dielectric of the transistors.

A distance 570 also separates adjacent pairs of the wires 120 in the Z-direction. The distance 570 is measured from the boundaries of the wires 120. In some embodiments, the distance 570 is in a range between about 4 nanometers and about 10 nanometers. This range is configured to give the spacer layers 390 a sufficient amount of space to form and to merge together. In more detail, FIGS. 12B-12D, 13B-13D, 14B-14D, and 15B-15D illustrate the X-cut cross-sectional views, Y-cut cross-sectional views, and Z-cut top views of four different scenarios, respectively. The position where the Z-cut is taken is illustrated in FIGS. 12C-15C.

Figure 12C:
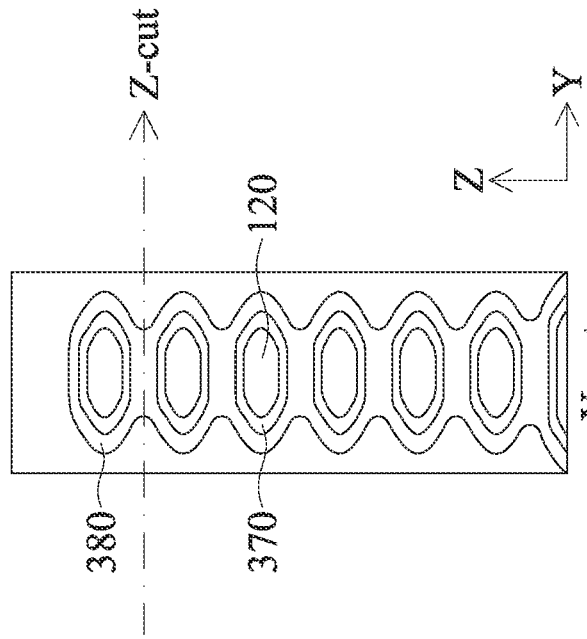
Figure 12D:
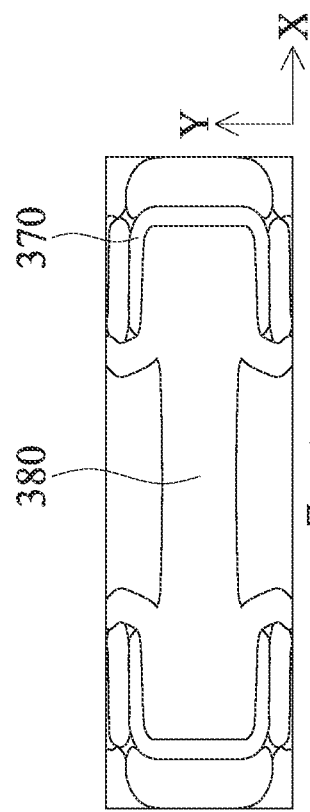
Figure 12B:
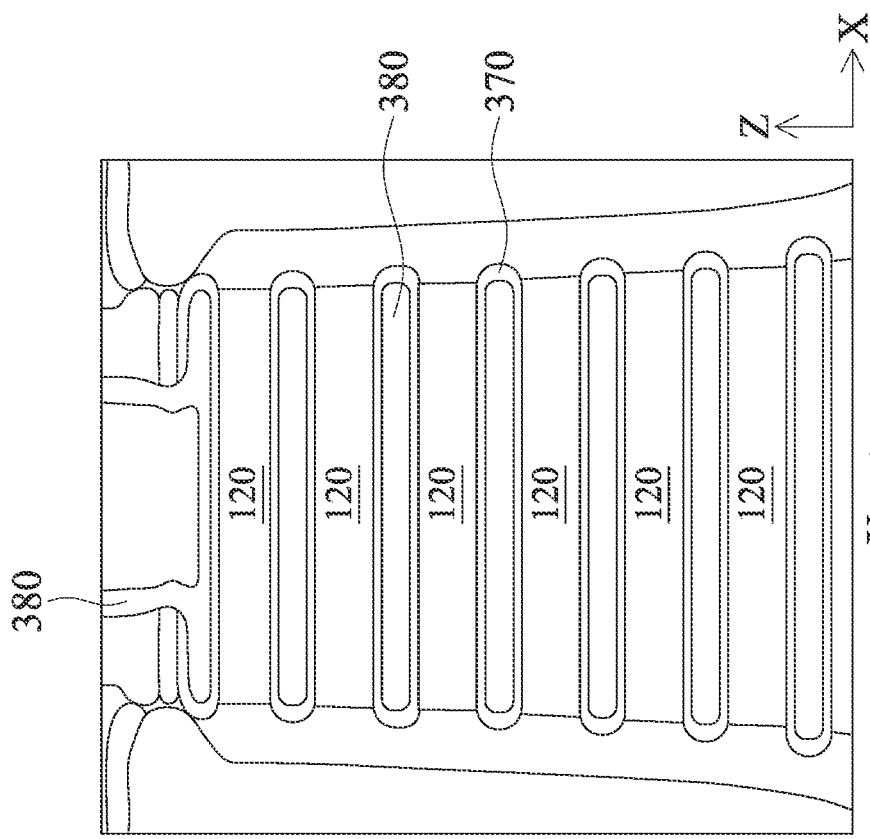

In a first scenario illustrated in FIGS. 12B-12C, the vertical distance between the vertically adjacent wires 120 is too small (e.g., less than about 4 nanometers). As a result, the spacer layers 380 merge together vertically, and there is no room for the formation of the spacer layers 390. This may be undesirable, since the spacer layers 380 include high-k dielectric materials, which could unduly increase the parasitic capacitance of the semiconductor structure.

Figure 13C:
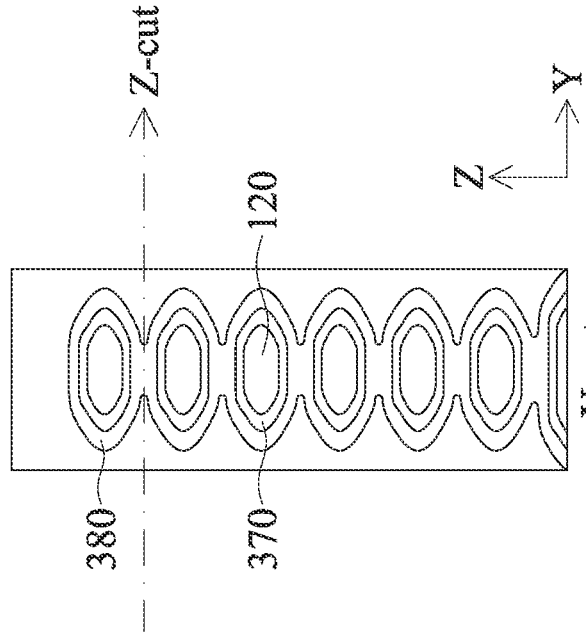
Figure 13D:
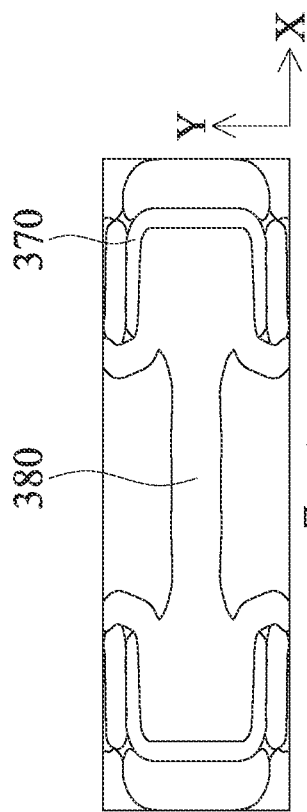
Figure 13B:
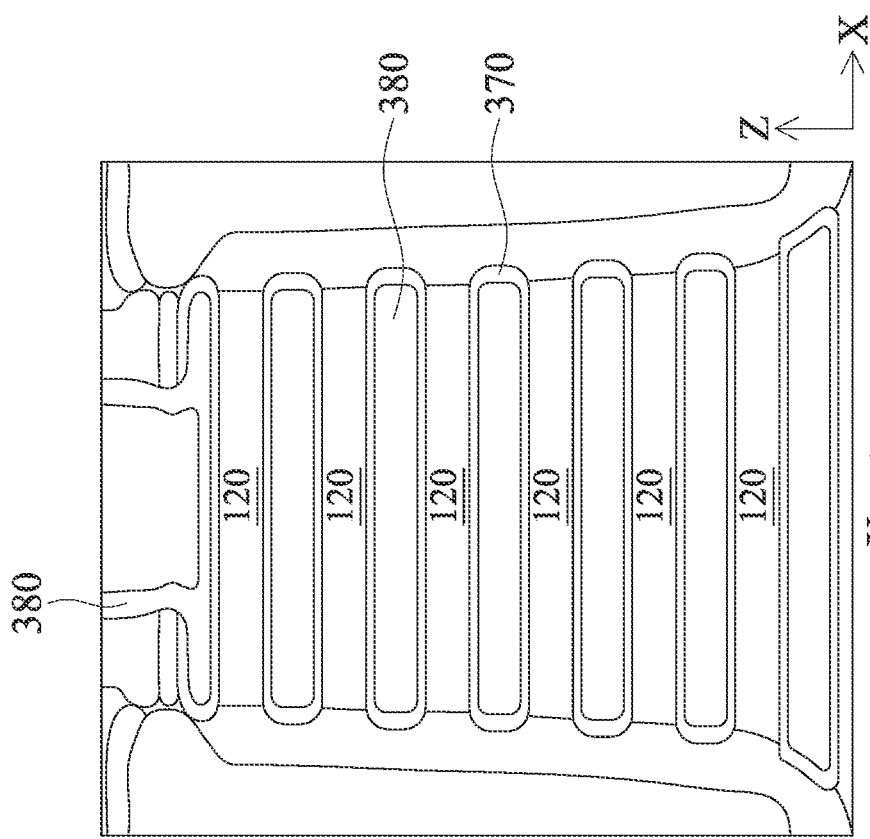

In a second scenario illustrated in FIGS. 13B-13D, the vertical distance between the vertically adjacent wires 120 is greater compared to the scenario shown in FIGS. 12B-12D, but it may still be too small (e.g., less than about 4 nanometers). As a result, the spacer layers 380 still merge together vertically, and there is no room for the formation of the spacer layers 390. Note that due to the greater vertical spacing between the wires 120, the merged spacer layers 380 may be thinner (in the Y-direction) in the second scenario shown in FIGS. 13B-13D compared to the first scenario shown in FIGS. 12B-12D. In any case, the lack of the spacer layers 390 is still undesirable, since the high-k dielectric material of the spacer layers 380 could unduly increase the parasitic capacitance of the semiconductor device 100.

Figure 14C:
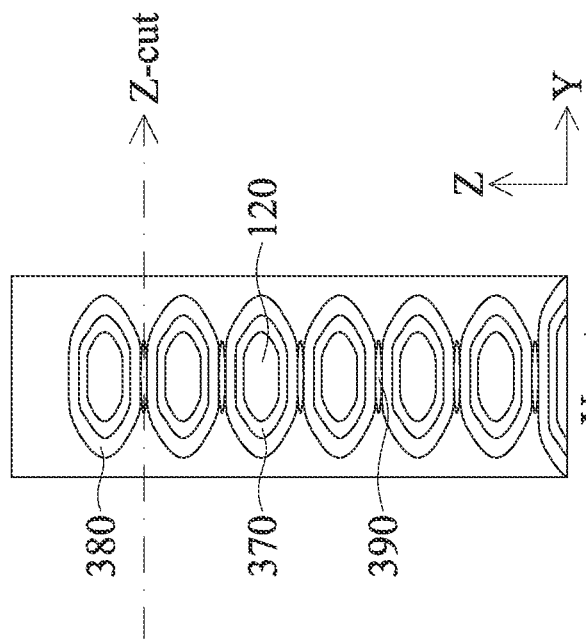
Figure 14D:
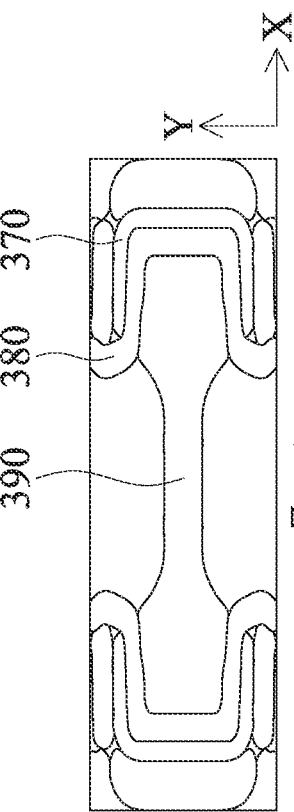
Figure 14B:
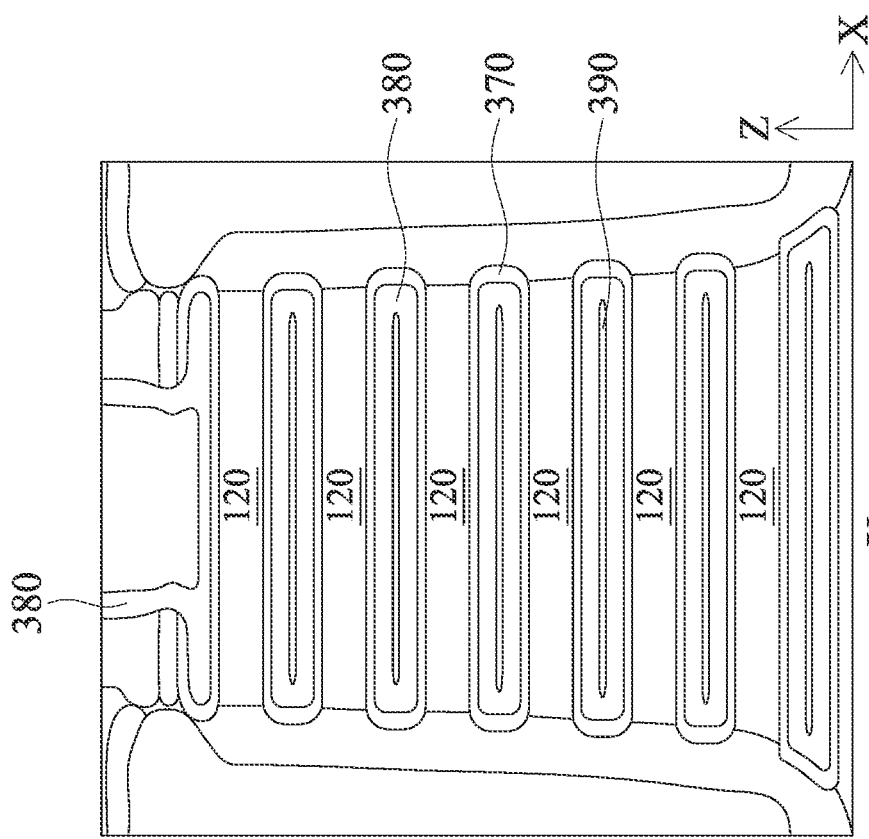

In a third scenario illustrated in FIGS. 14B-14D, the vertical distance between the vertically adjacent wires 120 is sufficient big (e.g., between about 4 nanometers and about 10 nanometers) to allow for the formation of the spacer layers 390. As a result, vertically adjacent spacer layers 390 merge together vertically. This is desirable, since the spacer layers 390 effectively thickens the "d" in the parasitic capacitance calculation, and the low-k dielectric material of the spacer layers 390 would not unduly contribute to the overall parasitic capacitance, as discussed above.

In a fourth scenario illustrated in FIGS. 15B-15D, the vertical distance between the vertically adjacent wires 120 is still sufficient big (e.g., between about 4 nanometers and about 10 nanometers) to allow for the formation of the spacer layers 390, but it may be getting close to the desired upper limit (e.g., about 10 nanometers). As can be seen in FIGS. 15C and 15D, although the vertically adjacent spacer layers 390 may merge together vertically, its lateral dimension (measured in the Y-direction) is thinner than the third scenario. In other words, the fourth scenario may still provide the benefits of parasitic capacitance reduction, but if the vertical distance between vertically adjacent wires 120 becomes much greater, then the spacer layers 390 would not be able to merge together vertically either, which could undermine the expected benefits discussed above.

Referring back to FIG. 11D, another unique physical characteristic of the present disclosure is that each of the spacer layers 390 may have a bone-like profile in the top view. In more detail, as shown in a more magnified view of the top view of the spacer layer 390, the spacer layer 390 may include a first end portion 390A, a second end portion 390B (opposite the first end portion 390A), and a middle portion 390C that joins the end portions 390A and 390B together. The end portions 390A and 390B may have a dimension 600 measured in the Y-direction, while the middle portion 390C may have a dimension 610 measured in the Y-direction. The dimension 610 is substantially smaller than the dimension 600 as a result of the spacer etching processes 400 being performed. For example, a ratio between the dimension 610 and the dimension 600 may be in a range between about 1:8 and about 1:25. The ratio range is configured such that the spacer layers 390 after the spacer etching processes 400 may be sufficiently wide to serve its purposes of acting as an extra dielectric material in a capacitor to reduce parasitic capacitance, while not too thick to interfere with the intended functionalities of the gate dielectric of transistors.

FIG. 16 is a flowchart illustrating a method 800 of manufacturing a semiconductor structure, for example a GAA device. The method 800 includes a step 810 of forming a stack of first semiconductor layers and second semiconductor layers. The first semiconductor layers and the second semiconductor layers have different material composition and alternate with one another within the stack The method 800 includes a step 820 of forming a dummy gate structure over the stack. The dummy gate structure wraps around top and side surfaces of the stack.

The method 800 includes a step 830 of growing source/drains on opposite sides of the dummy gate structure.

The method 800 includes a step 840 of forming an interlayer dielectric (ILD) over the source/drains.

The method 800 includes a step 850 of removing the dummy gate structure.

The method 800 includes a step 860 of performing a wire release process to remove the first semiconductor layers.

The method 800 includes a step 870 of depositing first spacer layers on the second semiconductor layers.

The method 800 includes a step 880 of depositing second spacer layers on the first spacer layers.

The method 800 includes a step 890 of depositing third spacer layers on the second spacer layers.

In some embodiments, the second spacer layers are formed to wrap around the first spacer layers circumferentially, the third spacer layers are formed to wrap around the second spacer layers circumferentially, and the third spacer layers that are vertically adjacent to another merge together. In some embodiments, the method 800 further includes a step of etching the third spacer layers so that a plurality of remaining portions of the third spacer layers no longer circumferentially wrap around the second spacer layers, but the remaining portions of the third spacer layers remain between adjacent second spacer layers.

In some embodiments, the second semiconductor layers are formed to each extend in a first horizontal direction. After the wire release process has been performed, each of the second semiconductor layers has a first dimension measured in a second horizontal direction that is perpendicular to the first horizontal direction. The remaining portions of the third spacer layers each have a second dimension measured in the second horizontal direction. The second dimension is smaller than the first dimension.

In some embodiments, the etching of the third spacer layers is performed such that each of the remaining portions of the third spacer layers has a bone-like top view profile. In some embodiments, the wire release process includes one or more etching processes having an etching selectivity between the first semiconductor layers and the second semiconductor layers. In some embodiments, the one or more etching processes reshape a profile of each of the second semiconductor layers into a rounded profile.

In some embodiments, the wire release process exposes surfaces of the second semiconductor layers circumferentially.

In some embodiments, the step 880 of depositing of the second spacer layers comprises depositing one or more high-k dielectric materials as the second spacer layers, and the step 890 of depositing of the third spacer layers comprises depositing one or more low-k dielectric materials as the third spacer layers.

In some embodiments, the step 850 of removing of the dummy gate structure forms an opening in place of the removed dummy gate structure. The method 800 may further include a step of filling the opening with a functional gate structure that includes a metal gate electrode. The metal gate electrode surrounds the second spacer layers and the third spacer layers.

It is understood that additional processes may be performed before, during, or after the steps 810-890. For example, the method 800 may include steps of forming contact openings, contact metal, as well as various contacts, vias, wires, and multilayer interconnect features (e.g., metal layers and interlayer dielectrics) to connect the various features to form a functional circuit that may include one or more multi-gate devices.

In summary, the present disclosure involves a plurality of fabrication processes to fabricate a GAA device. For example, a plurality of nanowires is formed by a wire release process (e.g., to remove one type of semiconductor layers but not another type of semiconductor layers in a stack of these semiconductor layers). A plurality of first spacer layers is formed on the nanowires as the interfacial layers of the GAA device. A plurality of second spacer layers (e.g., containing high-k dielectric materials) is formed on the first spacer layers as the gate dielectric of the GAA device. A plurality of third spacer layers (e.g., containing low-k dielectric materials) is formed on the second spacer layers. One or more etching processes may then be performed to partially remove the third spacer layers, and the remaining portions of the third spacer layers are disposed between the second spacer layers and may merge together vertically. A metal gate structure may then be formed to surround the nanowires, and more specifically, to surround the second spacer layers and the third spacer layers.

Based on the above discussions, it can be seen that the embodiments of the present disclosure offer advantages over conventional semiconductor devices. It is understood, however, that no particular advantage is required, other embodiments may offer different advantages, and that not all advantages are necessarily disclosed herein. One advantage is the reduction of parasitic capacitance. As discussed above, in conventional GAA devices, the only dielectric materials between the gate and the source/drain may be the interfacial layer and the high-k gate dielectric. Even the combined thickness of the interfacial layer and the high-k gate dielectric may still be too thin, which unfortunately increases parasitic capacitance, as parasitic capacitance is inversely correlated with the thickness of the dielectric material. Here, the addition of the spacer layers 390 effectively thickens the dielectric material, which helps to reduce parasitic capacitance. The spacer layers 390 are also configured to have a low-k dielectric material, which helps to further reduce the parasitic capacitance, as parasitic capacitance is correlated with the overall dielectric constant of the dielectric material. The reduction of parasitic capacitance is particularly useful in higher frequency applications, since parasitic capacitance may become a greater concern as the frequency of operation increases. As such, the present disclosure can improve the performance and/or reliability of GAA devices. Another advantage is that the processes of the present disclosure are compatible with existing fabrication process flow and are easy and cheap to implement.

One embodiment of the present disclosure involves a semiconductor device. The semiconductor device includes: a plurality of nanostructures, the nanostructures each containing a semiconductive material; a plurality of first spacers circumferentially wrapping around the nanostructures; a plurality of second spacers circumferentially wrapping around the first spacers; a plurality of third spacers disposed between the second spacers vertically; and a gate structure that surrounds the second spacers and the third spacers.

Another embodiment of the present disclosure involves a semiconductor device. The semiconductor device includes: a plurality of semiconductor layers that each extend in a first horizontal direction, wherein the semiconductor layers are located over one another in a vertical direction, and wherein each of the semiconductor layers has a first dimension measured in a second horizontal direction perpendicular to the first horizontal direction; a plurality of interfacial layers, wherein each of the interfacial layers circumferentially surrounds a respective one of the semiconductor layers in a cross-sectional view; a plurality of high-k dielectric layers, wherein each of the high-k dielectric layers circumferentially surrounds a respective one of the interfacial layers in the cross-sectional view; a plurality of low-k dielectric layers, wherein each of the low-k dielectric layers is disposed between two high-k dielectric layers that are vertically adjacent to one another, wherein each of the low-k dielectric layers has a second dimension measured in the second horizontal direction, and wherein the second dimension is smaller than the first dimension; and a gate structure that surrounds the high-k dielectric layers and the low-k dielectric layers.

Yet another embodiment of the present disclosure involves a method of fabricating a semiconductor device. A stack of first semiconductor layers and second semiconductor layers is formed. The first semiconductor layers and the second semiconductor layers have different material composition and alternate with one another within the stack. A dummy gate structure is formed over the stack. The dummy gate structure wraps around top and side surfaces of the stack. Source/drains are grown on opposite sides of the dummy gate structure. An interlayer dielectric (ILD) is formed over the source/drains. The dummy gate structure is removed. After the dummy gate structure has been removed, a nanostructures release process is performed to remove the first semiconductor layers. After the nanostructures release process has been performed, first spacer layers are deposited on the second semiconductor layers. Second spacer layers are deposited on the first spacer layers. Third spacer layers are deposited on the second spacer layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a nanostructure that contains a semiconductive material;
   a first spacer structure disposed above and below the nanostructure in a first cross-sectional side view, wherein the first spacer structure circumferentially surrounds the nanostructure in a second cross-sectional side view different from the first cross-sectional side view;
   a second spacer structure disposed above and below the first spacer structure in the first cross-sectional side view, wherein the second spacer structure circumferentially surrounds the first spacer structure in the second cross-sectional side view; and
   a first source/drain region and a second source/drain region;
   wherein:
   the nanostructure, the first spacer structure, and the second spacer structure are disposed between the first source/drain region and the second source/drain region in the first cross-sectional side view; and
   a side surface of the first source/drain region or a side surface of the second source/drain region extends to the first spacer structure.

2. The semiconductor device of claim 1, wherein the first spacer structure and the second spacer structure have different material compositions.

3. The semiconductor device of claim 1, further comprising a third spacer structure disposed above and below the second spacer structure in the first cross-sectional side view, wherein the third spacer structure is substantially narrower than the second spacer structure in the second cross-sectional side view.

4. The semiconductor device of claim 3, wherein:
   the first spacer structure contains an oxide material;
   the second spacer structure contains a high-k dielectric material; and
   the third spacer structure contains a low-k dielectric material.

5. The semiconductor device of claim 3, wherein the third spacer structure has a top view profile that includes wider end portions and a narrower middle portion connecting the wider end portions.

6. The semiconductor device of claim 1, wherein the first source/drain region and the second source/drain region are not directly visible in the second cross-sectional side view.

7. The semiconductor device of claim 1, wherein a side surface of the first source/drain region or a side surface of the second source/drain region is in direct contact with the nanostructure.

8. The semiconductor device of claim 1, further comprising a gate structure, wherein the gate structure wraps around the second spacer structure in the second cross-sectional side view.

9. The semiconductor device of claim 1, wherein the nanostructure, the first spacer structure, or the second spacer structure have more rounded surfaces in the second cross-sectional side view than in the first cross-sectional side view.

10. A semiconductor device, comprising:
    a plurality of nanostructures that each contains a semiconductive material;
    a plurality of first spacers interspersed among the nanostructure in a first cross-sectional side view, wherein the first spacers each contains a first type of material that contains oxygen and silicon; and
    a plurality of second spacers interspersed among the first spacers in the first cross-sectional side view, wherein the second spacers each contains a second type of material that comprises oxygen and one or more elements other than silicon, wherein each of the nanostructures extends to a respective one of the first spacers, but not to any of the second spacers, and wherein the second spacers are narrower than the first spacers in the first cross-sectional side view.

11. The semiconductor device of claim 10, wherein in a second cross-sectional side view different from the first cross-sectional side view:
    each of the nanostructures is encircled in 360 degrees by a respective one of the first spacers; and
    each of the first spacers is encircled in 360 degrees by a respective one of the second spacers.

12. The semiconductor device of claim 11, further comprising a gate structure, wherein the nanostructures, the first spacers, and the second spacers each have a more curved profile in the second cross-sectional side view than in the first cross-sectional side view, and wherein the gate structure wraps around each of the second spacers in the second cross-sectional side view.

13. The semiconductor device of claim 10, further comprising a plurality of third spacers interspersed among the second spacers, wherein the third spacers have a different material composition than the second spacers, and wherein the third spacers are in direct contact with the second spacers, but not in direct contact with the first spacers or with the nanostructures.

14. The semiconductor device of claim 13, wherein in a planar top view, a topmost one of the third spacers includes two end segments and a middle segment, the middle segment extending in a first direction, and wherein each of the end segments is wider than the middle segment in a second direction different from the first direction.

15. The semiconductor device of claim 10, further comprising a first source/drain component and a second source/drain component, wherein the nanostructures, the first spacers, and the second spacers are disposed between the first source/drain component and the second source/drain component in the first cross-sectional side view, and wherein a side surface of the first source/drain component or a side surface of the second source/drain component is in direct contact with the first spacers or in direct contact with the nanostructures.

16. A semiconductor device, comprising:
a plurality of nanostructures that each contains a semiconductive material, wherein the nanostructures are arranged into a vertical stack where each of the nanostructures is separated from adjacent ones of the nanostructures in a first cross-sectional side view; and
a plurality of spacers disposed between the nanostructures in the vertical stack, wherein the spacers have more rounded surfaces in a second cross-sectional side view than in the first cross-sectional side view, and wherein the spacers include at least two different types of materials.

17. The semiconductor device of claim 16, wherein:
the spacers include a plurality of first spacers, a plurality of second spacers, and a plurality of third spacers;
each of the first spacers circumferentially surrounds a respective one of the nanostructures in the second cross-sectional side view;
each of the second spacers circumferentially surrounds a respective one of the first spacers in the second cross-sectional side view; and
each of the third spacers is disposed between, but does not circumferentially surround, an adjacent pair of the second spacers in the second cross-sectional side view.

18. The semiconductor device of claim 16, further comprising a first epilayer and a second epilayer, wherein the first epilayer and the second epilayer are disposed on opposite sides of the vertical stack in the first cross-sectional side view but are not directly visible in the second cross-sectional side view.

19. The semiconductor device of claim 16, wherein the spacers include at least three different types of materials.

20. The semiconductor device of claim 16, wherein:
the first cross-sectional side view is taken along a vertical direction and a first horizontal direction; and
the second cross-sectional side view is taken along the vertical direction and a second horizontal direction perpendicular to the first horizontal direction.

* * * * *